(12) United States Patent
Ellinger et al.

(10) Patent No.: US 9,859,308 B1
(45) Date of Patent: Jan. 2, 2018

(54) MULTIPLE TFTS ON COMMON VERTICAL SUPPORT ELEMENT

(71) Applicant: Eastman Kodak Company, Rochester, NY (US)

(72) Inventors: Carolyn Rae Ellinger, Rochester, NY (US); Shelby Forrester Nelson, Pittsford, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 15/223,060

(22) Filed: Jul. 29, 2016

(51) Int. Cl.
*H01L 29/06* (2006.01)
*H01L 27/12* (2006.01)
*H01L 29/786* (2006.01)
*H01L 21/02* (2006.01)

(52) U.S. Cl.
CPC ...... *H01L 27/1251* (2013.01); *H01L 21/0228* (2013.01); *H01L 21/0262* (2013.01); *H01L 27/1218* (2013.01); *H01L 27/1225* (2013.01); *H01L 29/78603* (2013.01); *H01L 29/786* (2013.01); *H01L 29/78642* (2013.01)

(58) Field of Classification Search
CPC .......... H01L 27/1251; H01L 29/78603; H01L 27/1218; H01L 21/0262; H01L 27/1225; H01L 21/0228; H01L 29/786; H01L 29/78642; H01L 21/82285; H01L 21/823487; H01L 21/823885; H01L 27/0825–27/0826; H01L 27/10841; H01L 27/2454
See application file for complete search history.

(56) References Cited

U.S. PATENT DOCUMENTS

| | | |
|---|---|---|
| 7,413,982 B2 | 8/2008 | Levy |
| 7,456,429 B2 | 11/2008 | Levy |
| 7,789,961 B2 | 9/2010 | Nelson et al. |
| 8,653,516 B1 | 2/2014 | Nelson et al. |
| 8,791,023 B2 | 7/2014 | Ellinger et al. |
| 8,846,545 B2 | 9/2014 | Ellinger et al. |
| 8,927,434 B2 | 1/2015 | Ellinger et al. |
| 9,093,470 B1 | 7/2015 | Nelson et al. |
| 9,117,914 B1 | 8/2015 | Ellinger et al. |
| 9,123,815 B1 | 9/2015 | Nelson et al. |
| 9,129,993 B1 | 9/2015 | Ellinger et al. |
| 9,142,647 B1 | 9/2015 | Nelson et al. |
| 9,147,770 B1 | 9/2015 | Ellinger |

(Continued)

OTHER PUBLICATIONS

Dodabalapur et al., "Organic Transistors Two Dimensional Transport and Improved Electrical Characteristics", *Science*, Apr. 1995, pp. 270-271.

(Continued)

*Primary Examiner* — Cuong B Nguyen
(74) *Attorney, Agent, or Firm* — Kevin E. Spaulding

(57) ABSTRACT

An electronic element includes a substrate, and a vertical-support-element located on the substrate, the vertical-support-element extending away from the substrate and having a perimeter over the substrate, wherein the vertical-support-element has a reentrant profile around at least a portion of the perimeter. Three or more vertical transistors are positioned around the perimeter of the vertical-support-element, each of the transistors having a semiconductor channel being located in a corresponding region of the reentrant profile.

22 Claims, 14 Drawing Sheets

(56) References Cited

U.S. PATENT DOCUMENTS

| | | |
|---|---|---|
| 9,198,283 B2 | 11/2015 | Ellinger |
| 9,202,898 B2 | 12/2015 | Ellinger et al. |
| 9,214,560 B2 | 12/2015 | Nelson et al. |
| 9,236,486 B2 | 1/2016 | Nelson et al. |
| 9,368,490 B2 | 6/2016 | Ellinger et al. |
| 9,401,430 B1 | 7/2016 | Ellinger et al. |
| 9,443,887 B1 * | 9/2016 | Ellinger .............. H01L 27/1251 |
| 2009/0130858 A1 | 5/2009 | Levy |
| 2014/0061648 A1 | 3/2014 | Levy et al. |
| 2014/0061795 A1 | 3/2014 | Levy et al. |
| 2014/0061869 A1 | 3/2014 | Nelson et al. |
| 2014/0065838 A1 | 3/2014 | Ellinger et al. |
| 2014/0377943 A1 * | 12/2014 | Tutt .................. H01L 29/66742 438/586 |
| 2015/0257283 A1 | 9/2015 | Ellinger et al. |
| 2015/0294977 A1 * | 10/2015 | Kim .................. H01L 27/11573 257/314 |
| 2016/0365369 A1 * | 12/2016 | Ellinger .............. H01L 27/1251 |

OTHER PUBLICATIONS

Sze, "Physics of Semiconductor Devices", *Semiconductor Devices—Physics and Technology*, John Wiley & Sons, 1981, pp. 438-443.

Sinha, A. et al., *Journal of Science and Technology B*, vol. 24, No. 6, Nov./Dec. 2006, pp. 2523-2532.

* cited by examiner

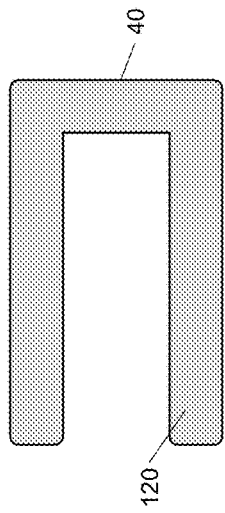
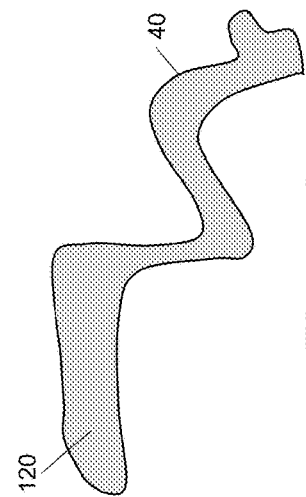
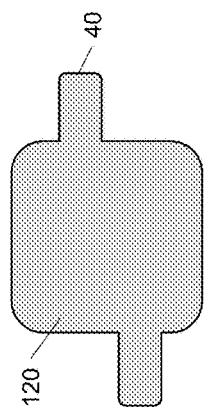
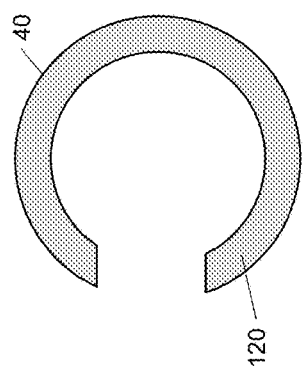
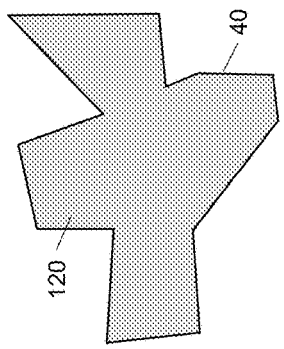
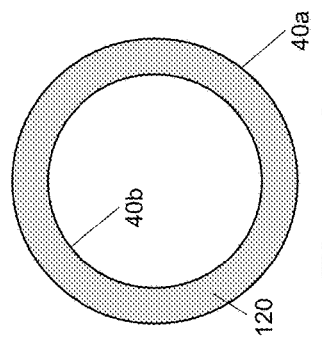
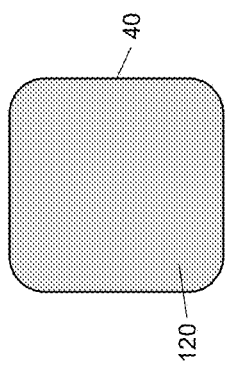

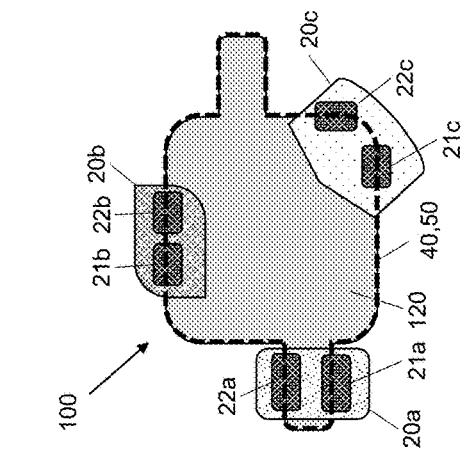
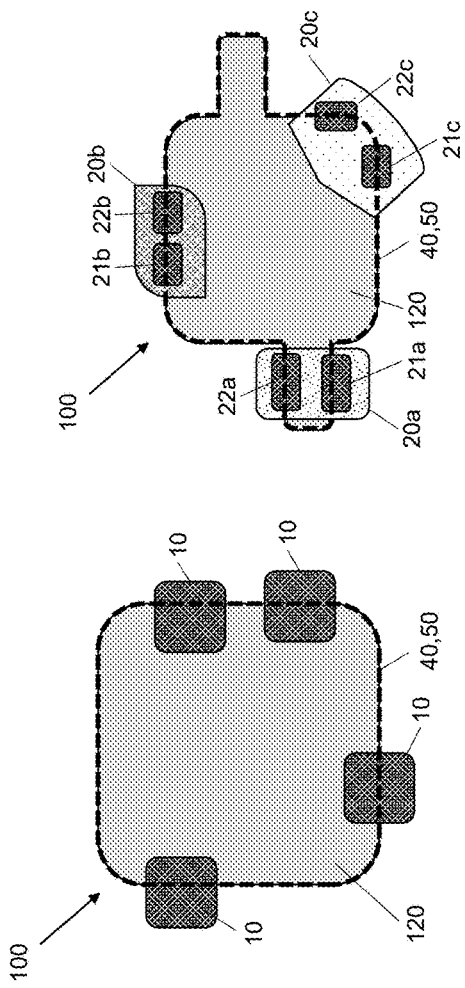
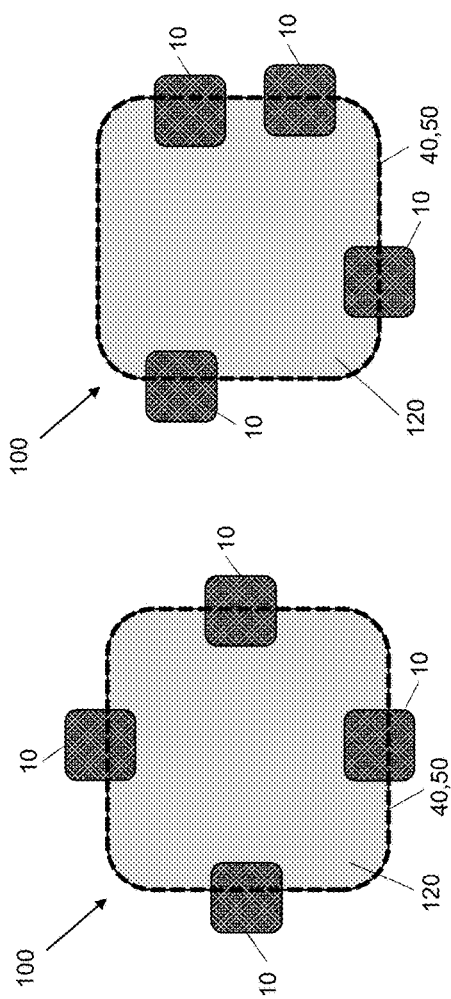
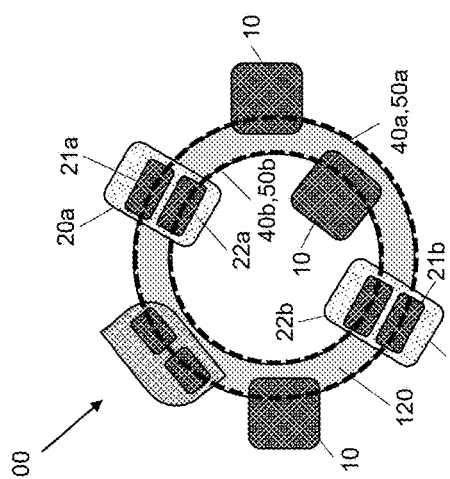
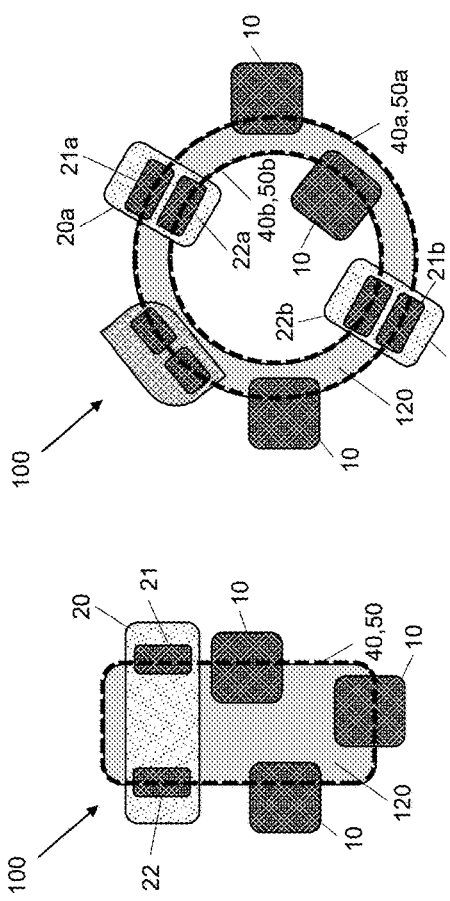
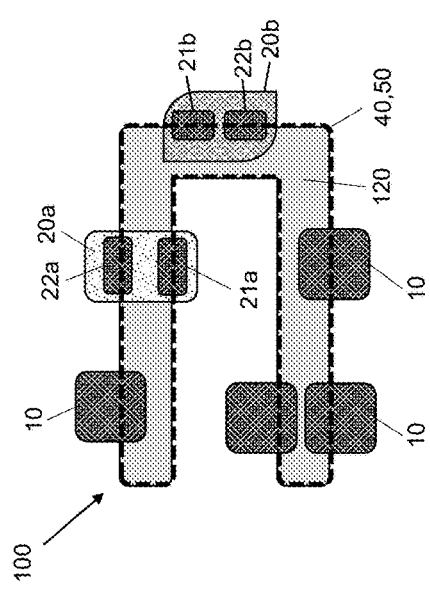

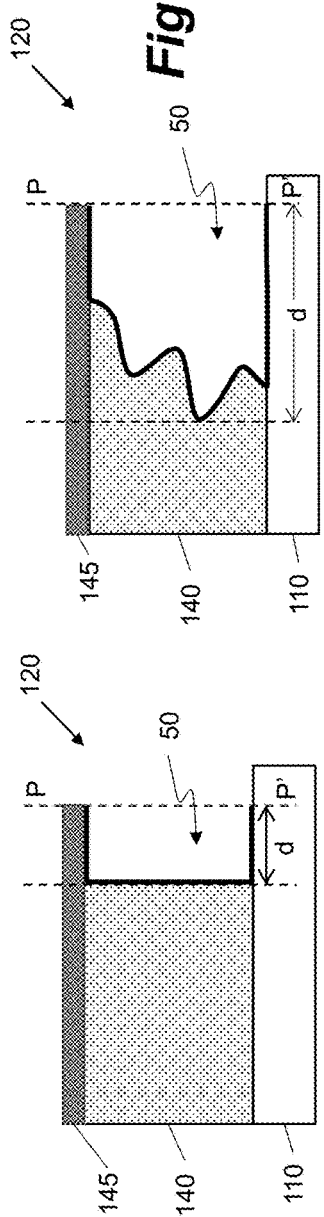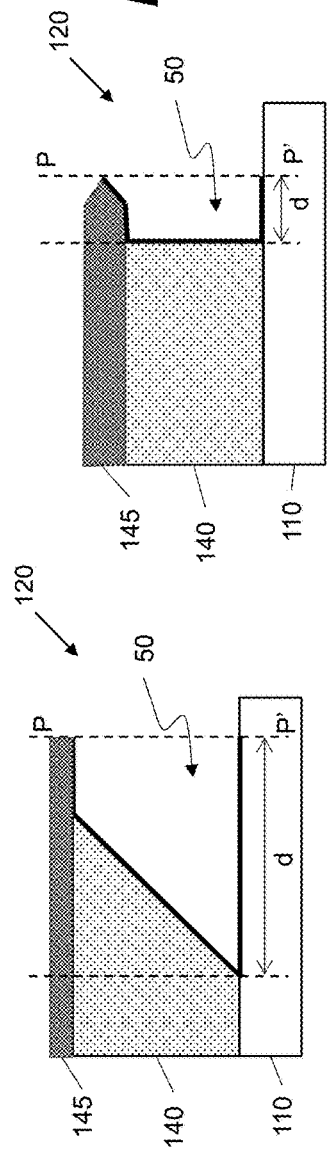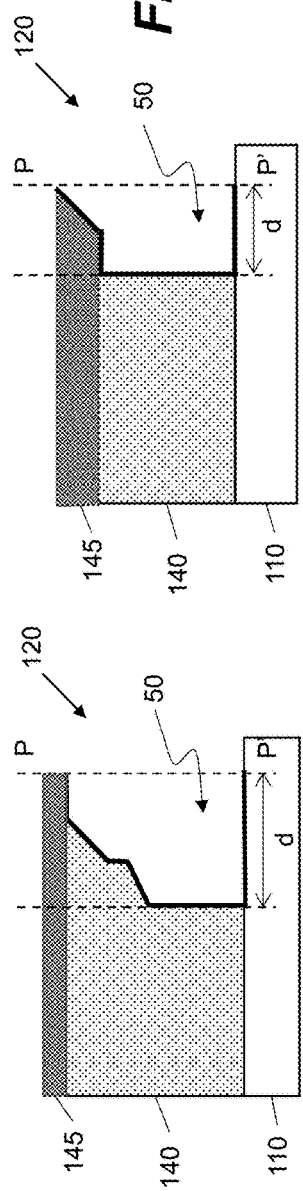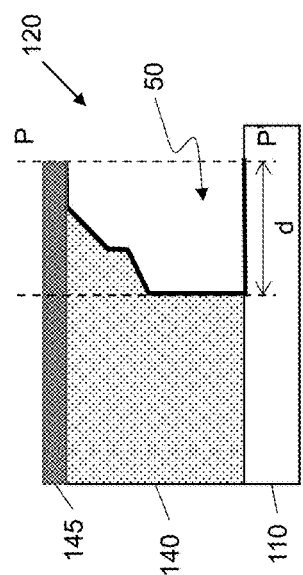

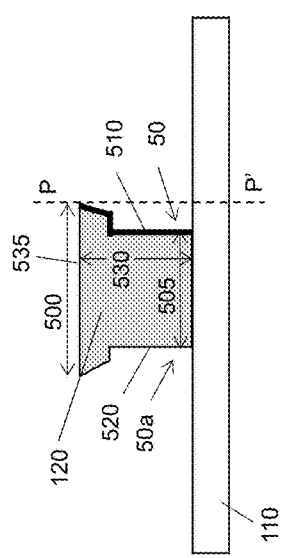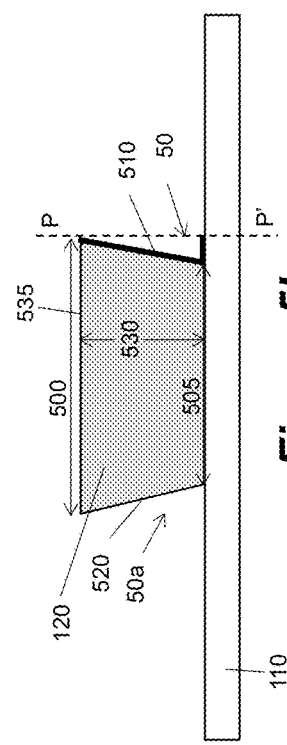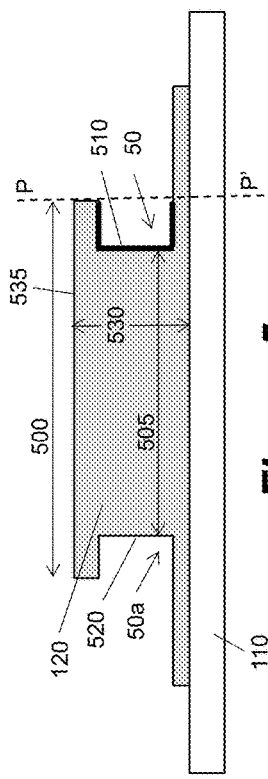

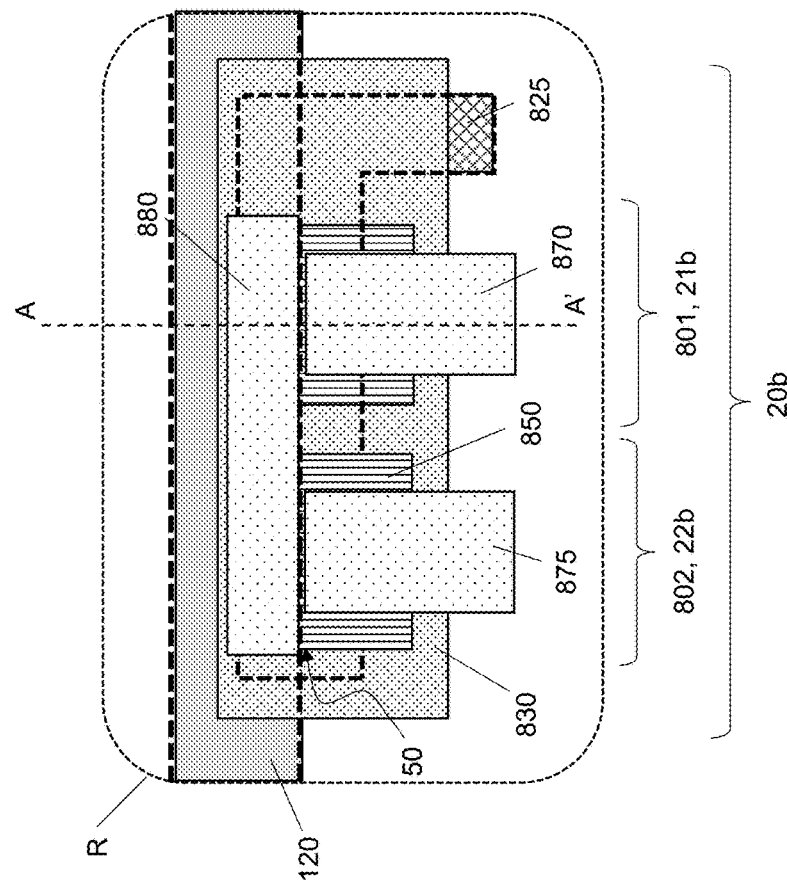
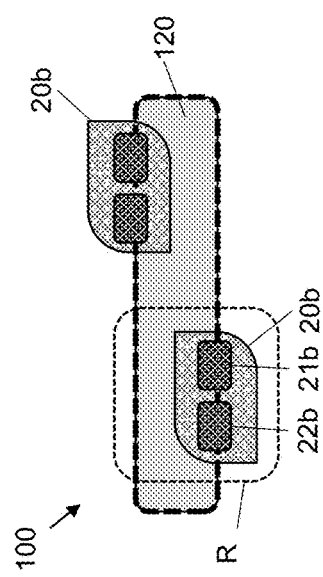
*Figure 7b*
*Figure 7a*

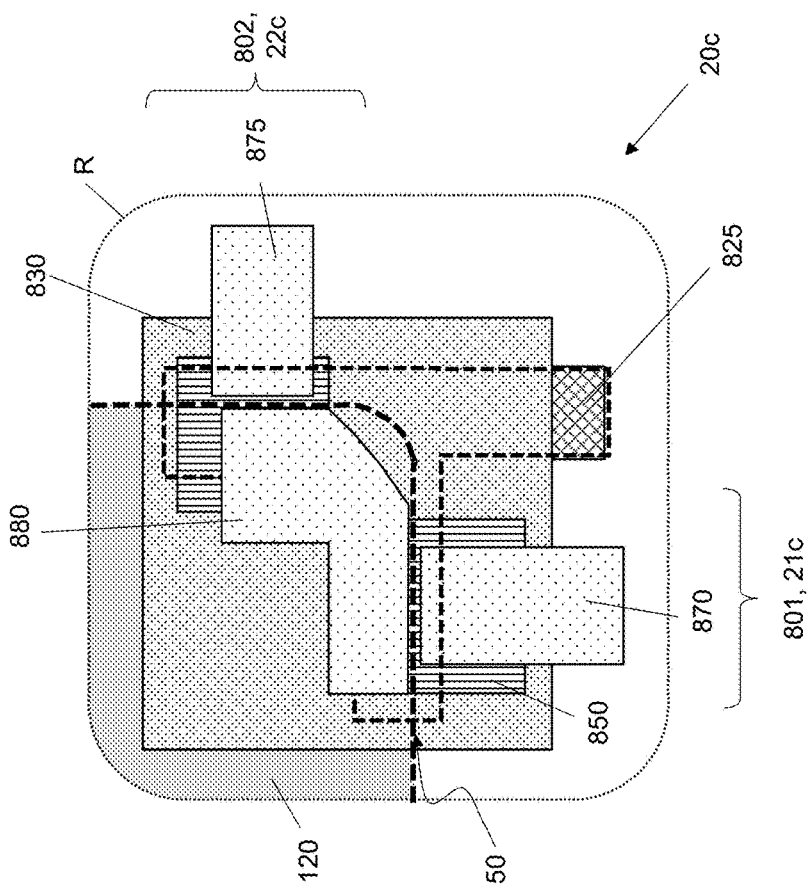
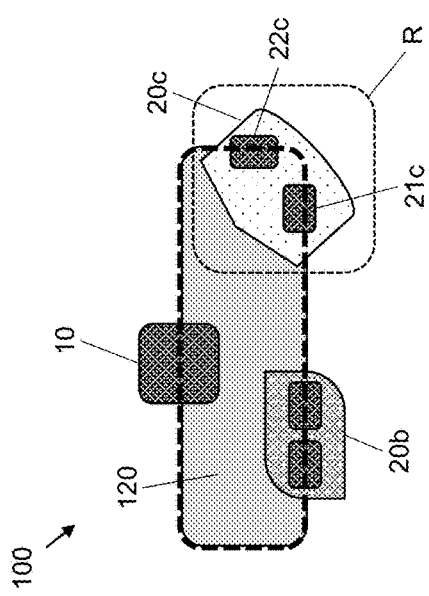
*Figure 8b*
*Figure 8a*

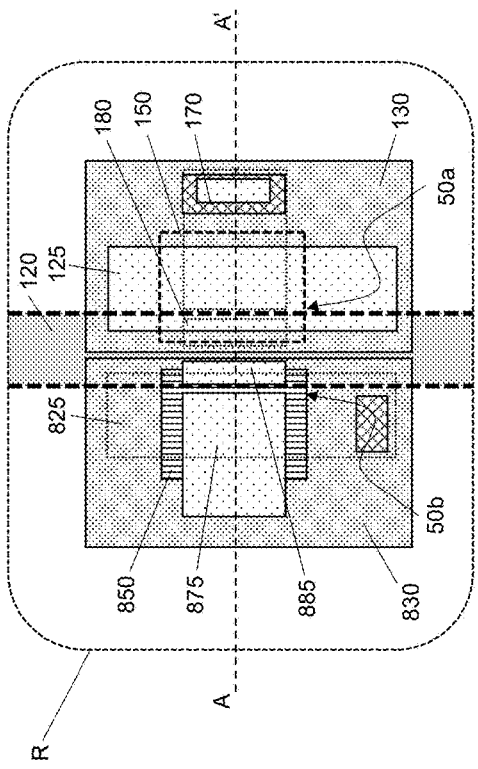
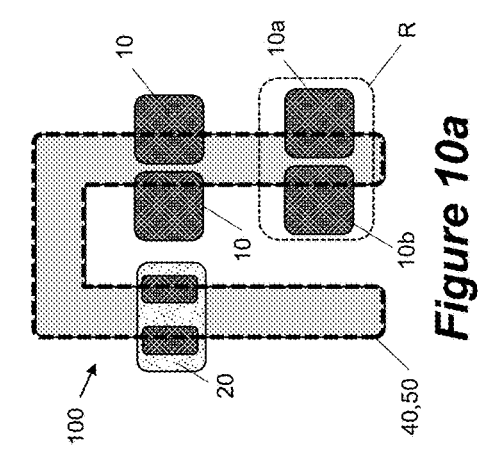
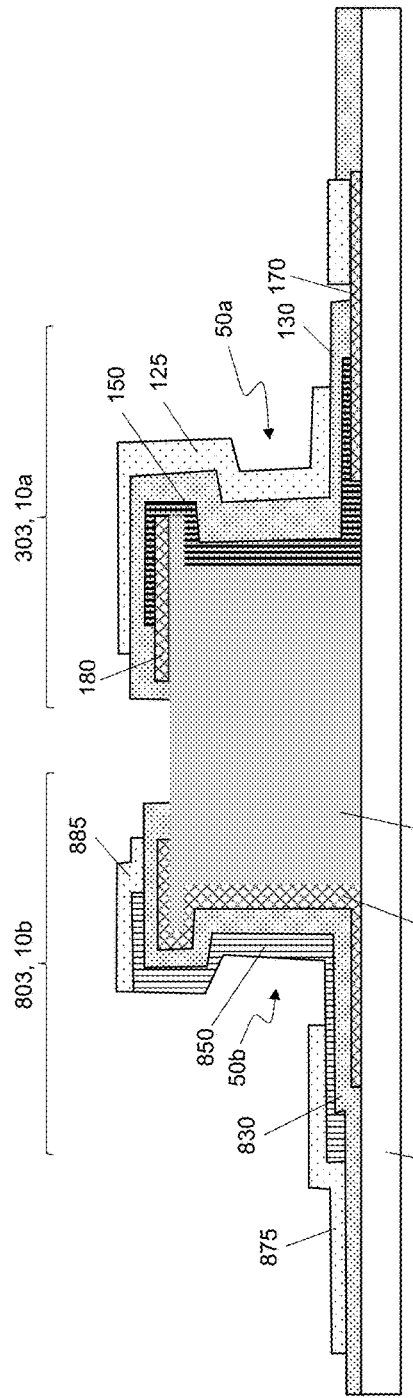
Figure 10a
Figure 10b
Figure 10c

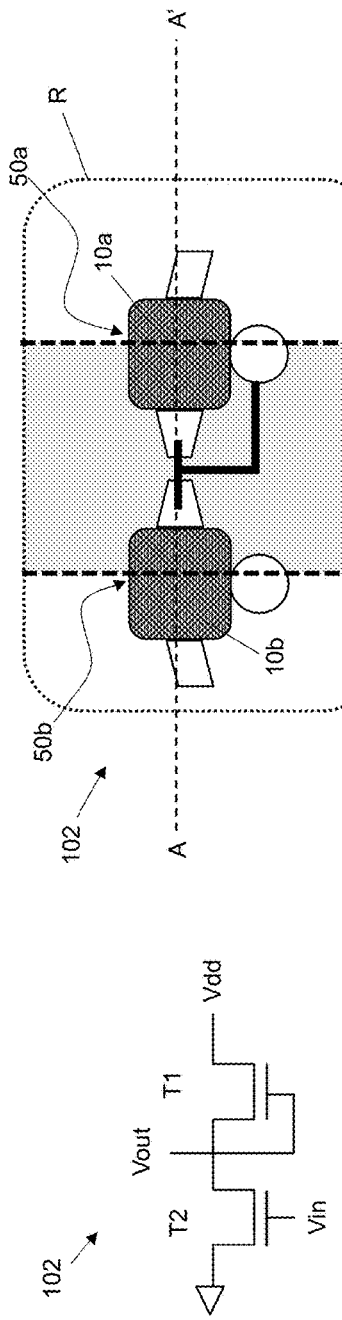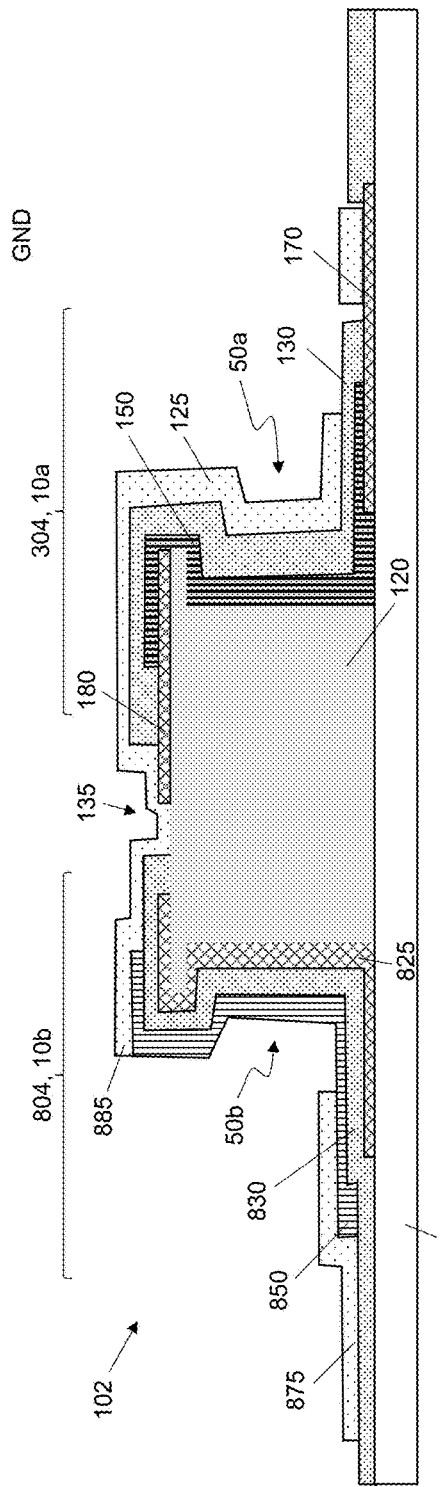

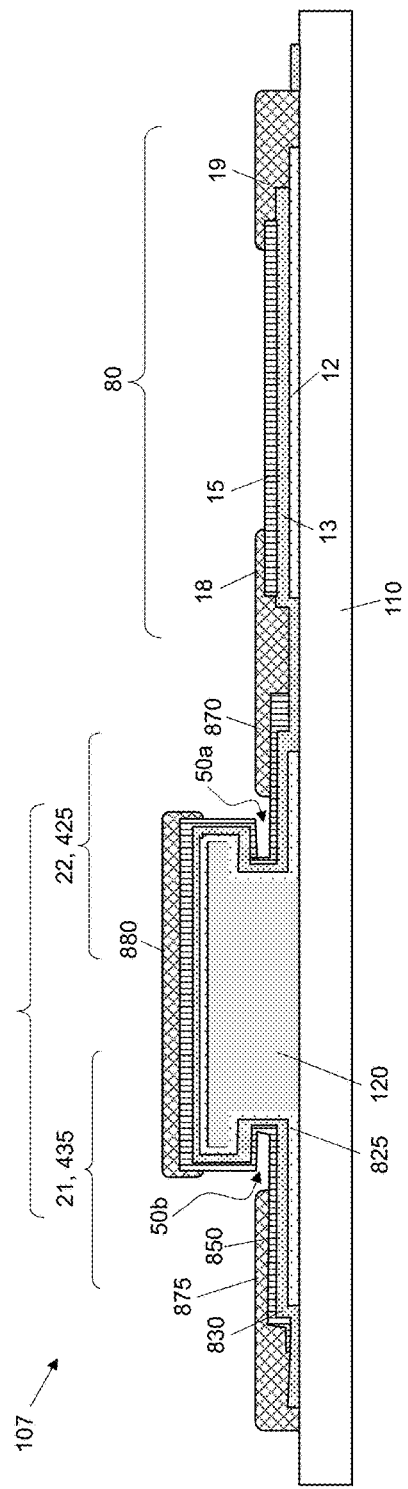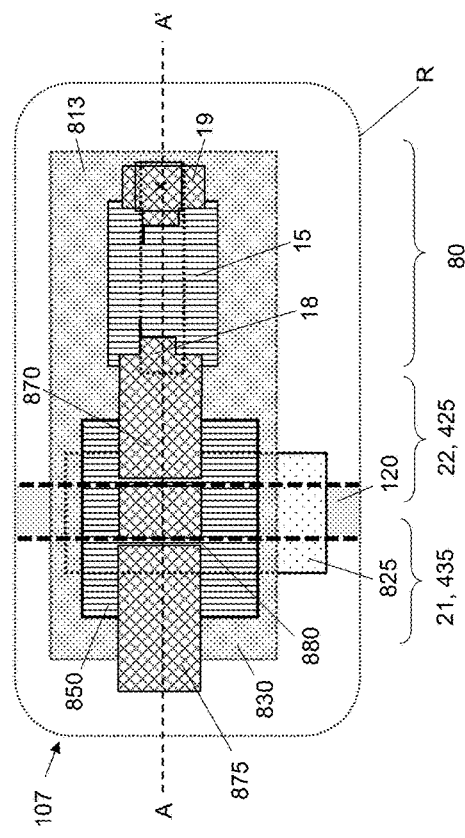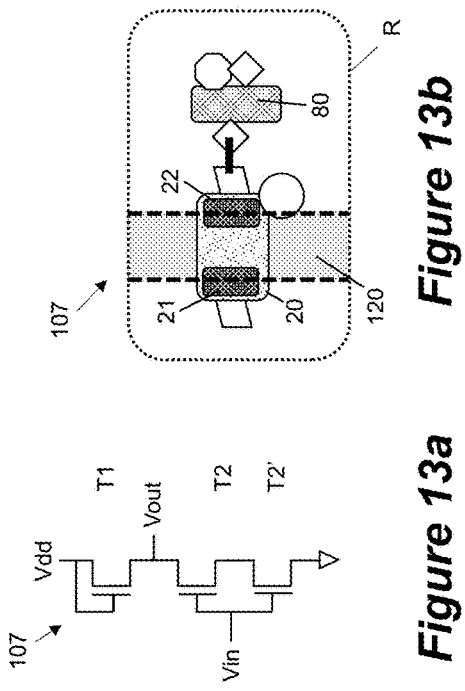
Figure 13a
Figure 13b
Figure 13c
Figure 13d

MULTIPLE TFTS ON COMMON VERTICAL SUPPORT ELEMENT

CROSS REFERENCE TO RELATED APPLICATIONS

Reference is made to commonly-assigned, U.S. patent application Ser. No. 14/737,544, by C. Ellinger et al., entitled "Vertical and planar TFTs on common substrate;" to commonly-assigned, U.S. patent application Ser. No. 14/737,549, by C. Ellinger et al., entitled "VTFT with a top-gate structure;" to U.S. patent application Ser. No. 14/737,560, by C. Ellinger et al., entitled "Bottom-gate and top-gate VTFTs on common structure;" and to U.S. patent application Ser. No. 14/737,577, by C. Ellinger et al., entitled "Dual-gate VTFT," each of which is incorporated herein by reference.

FIELD OF THE INVENTION

This invention relates generally to electronic elements and semiconductor devices, and more particularly to electronic elements composed of multiple transistor devices.

BACKGROUND OF THE INVENTION

Modern-day electronics systems require multiple patterned layers of electrically or optically active materials, sometimes over a relatively large substrate. Electronics such as radio frequency identification (RFID) tags, photovoltaics, and optical and chemical sensors all require some level of patterning in their electronic circuitry. Flat panel displays, such as liquid crystal displays or electroluminescent displays rely upon accurately patterned sequential layers to form thin film components of the backplane. These electronic components include capacitors, transistors, and power buses. The usual combination of photolithographic patterning methods and selective etch processes has several shortcomings including high cost, difficulty with large substrates, and complexity of selective etch processes.

The feature size obtainable using traditional processing methods is limited by the resolution of the photolithography tools. Currently the minimum feature size for large area display backplanes is around a micron, and requires expensive high end equipment. Minimum feature sizes for large area substrates with less expensive equipment can be much larger. High speed circuit operation requires thin film transistors (TFTs) with high drive current, and many applications additionally require that the drive current be obtained with low voltage operation. It is well known that TFT performance is improved by reducing the channel length. To move beyond the exposure limitation of feature size, vertical transistors of various architectures are currently being studied. In a vertical TFT (VTFT) architecture, the channel is formed perpendicular to the substrate, and therefore the channel length (L) can be controlled by the height of a layer in the transistor.

Recent work in the fabrication of VTFTs, while yielding short channel length devices, has used otherwise standard photolithographic techniques with complex semiconductor processes. For example, since it is not currently possible to put patterns directly on walls which are vertical with respect to the substrate surface, vertical wall patterning has been accomplished using a suitable temporary filler material to partially fill in a trench. The temporary filler material acts as a mask for the portions of the wall located underneath while allowing for processing of the walls above the temporary filler material. This has been used, for example, when an oxide is to be deposited exclusively on vertical walls below a temporary filler material, where the oxide is first deposited or produced over the entire surface of the relief. The relief or trench is initially completely filled with a suitable temporary filler material. Then, the temporary filler material is recessed back to a depth that just covers the desired oxide. After uncovered sections of the oxide are removed, the remaining temporary filler material is removed.

Alternatively, when it is necessary that an oxide be deposited or produced only in upper regions of a vertical wall, an etching stop layer, for example a nitride layer, is first provided over the entire surface of the entire relief pattern. A different material, susceptible to directional etching, for example polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched, such that oxide material is only removed on horizontal surfaces but not on vertical ones. This is followed by removal of the filler material and then the removal of the etching stop layer.

In light of the complicated existing processes there is an ongoing need to provide semiconductor device architectures that include patterned vertical or inclined device surfaces. There is also an ongoing need to provide simple manufacturing techniques capable of processing small device features of semiconductor devices without requiring high resolution alignments and small gap printing for vertical TFTs. There is also an ongoing need to provide higher current semiconductor devices by improving the series resistance of the device.

A particularly useful electronic device in building functional circuitry is an inverter, which functions to invert the polarity of an input signal. In CMOS circuitry, inverters are typically easy to design but can be disadvantageously expensive to produce and utilize complicated production processes. It is possible to build all NMOS or PMOS inverters, and in some instances it is advantageous to use enhancement-depletion-mode to better mimic the advantages of CMOS circuits, however there can be challenges to independently controlling the behavior of each transistor in the inverter circuit. As the industry endeavors to build circuitry using printing methods, individual transistor size has a direct impact on the overall circuit footprint, as the individual component transistors are sized using their channel dimensions. There remains a need to build high quality inverters using simple processes, by employing novel architectures to control individual transistor, and therefore, circuit performance.

One challenge with integrating vertical transistors into more complex circuits is their vertical nature often places their source and drain electrodes at different distances from the substrate, or put another way, in different planes. The location of accessible contact to the terminals of the transistor will often dictate complicated manufacturing techniques for deep vias, or complex circuit designs to physically form the necessary electrical connections. Furthermore, vertical transistors require a vertical element, and most commonly are arranged such that a single vertical transistor is associated with a single vertical element. There are instances where two vertical transistors share a common vertical element, however these previous embodiments still have challenges for integration into complex circuits.

There remains a need to build high quality inverters and other circuit elements using simple processes, by employing novel architectures to control transistor, and therefore, circuit performance. Furthermore, there still remains a need for circuit elements containing vertical transistors to be easily fabricated with facile physical and electrical connections between individual transistor components. Additionally, there is a need to be able to mix and match components for the best circuit design, rather than being limited by the capabilities of conventional processes and to minimize the footprint required.

SUMMARY OF THE INVENTION

The present invention represents an electronic element comprising:

a substrate;

a vertical-support-element located on the substrate, the vertical-support-element extending away from the substrate and having a perimeter over the substrate, wherein the vertical-support-element has a reentrant profile around at least a portion of the perimeter; and three or more vertical transistors positioned around the perimeter of the vertical-support-element, each of the transistors having a semiconductor channel being located in a corresponding region of the reentrant profile.

This invention has the advantage that the footprint of the group of vertical transistors can be small because the connections between transistors can be chosen to be either on top of the vertical-support-element or on the substrate not on the vertical-support-element, as best suits the circuit design.

It has the additional advantage that electrical connections such as power and output leads to the vertical transistors can be chosen to be on the substrate and not on the vertical-support-element for simplicity.

BRIEF DESCRIPTION OF THE DRAWINGS

FIGS. 2a-2h illustrate a variety of exemplary shapes for vertical-support-elements in accordance with the present invention;

FIGS. 3a-3f are illustrations of embodiments of the present invention having multiple vertical transistors on common vertical-support-elements;

FIGS. 4a-4f are various examples of vertical-support-elements having reentrant profiles;

FIGS. 5a-5c are schematic cross-sectional views of alternative vertical-support-elements having reentrant profiles;

FIG. 6b is a schematic illustration showing an exemplary embodiment of the present invention having three series-connected vertical transistor pairs; each pair being equivalent to the circuit of FIG. 6a;

FIGS. 7a and 7b are a schematic illustration and a plan view, respectively, of a pair of series-connected bottom-gate vertical transistors formed on adjacent portions of the reentrant profile on the same side of a vertical support structure;

FIGS. 8a and 8b are a schematic illustration and a plan view, respectively, of a pair of series-connected bottom-gate vertical transistors formed on adjacent portions of the reentrant profile on adjacent sides of a vertical support structure;

FIGS. 9b and 9c are a cross-sectional view and a plan view, respectively, of a pair of series-connected top-gate vertical transistors as shown in the schematic illustration of FIG. 9a;

FIG. 10a is a schematic illustration showing an exemplary embodiment of the present invention including four independently-operable vertical transistors formed on a common vertical-support-element, together with a series-connected vertical transistor pair;

FIGS. 10b and 10bc are a plan view and cross-sectional view, respectively, of an independently-operable top-gate vertical transistor and an independently-operable bottom-gate transistor on the same vertical-support-element as shown in the schematic illustration of FIG. 10a;

FIG. 11a is a circuit diagram of an enhancement-depletion-mode inverter;

FIGS. 11b and 11c are a schematic illustration and a cross-sectional view, respectively, of a top-gate vertical transistor and a bottom-gate vertical transistor on the same vertical-support-element operable as an enhancement-depletion-mode inverter equivalent to the circuit of FIG. 11a;

FIG. 13a is a circuit diagram of an all-enhancement-mode inverter;

FIG. 13b is a schematic illustration showing an exemplary all-enhancement-mode inverter equivalent to the circuit of FIG. 13a formed with a series-connected vertical transistor pair and a planar thin film transistor;

FIGS. 13c and 13d are a schematic illustration and a cross-sectional view, respectively, of a series-connected vertical transistor pair including two bottom-gate vertical transistors and a planar bottom-gate thin film transistor configured to be operable as an all-enhancement-mode inverter as shown in the schematic illustration of FIG. 13b.

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1C:
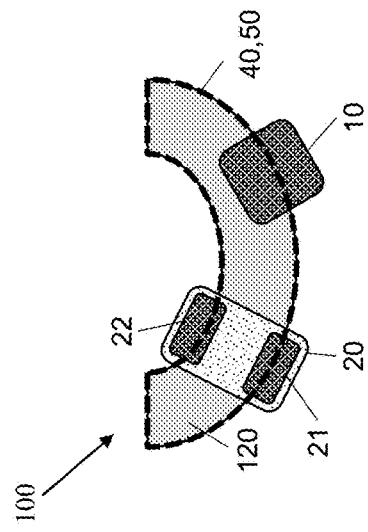
FIGS. 1a-1c are illustrations of three different embodiments of the present invention showing a plurality of vertical transistors on common vertical-support-elements.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "top," "bottom," "left," "right" are used with reference to the orientation of the Figure(s) being described. Because components of embodiments of the present invention can be positioned in a number of different orientations, the directional terminology is used for purposes of illustration only and is in no way limiting.

It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and are not to scale for the sake of clarity. One of ordinary skill in the art will be able to readily determine the specific size and interconnections of the elements of the example embodiments of the present invention. Therefore, the figures provided are not drawn to scale, but are intended to show overall function and the structural arrangement of some embodiments of the present invention.

Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

The embodiments of the present invention all relate to thin film inorganic materials and devices that contain them. In preferred embodiments the thin film inorganic materials are deposited using an atomic layer deposition (ALD) process. For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art.

The term "over" refers to the relative position of an element to another and is insensitive to orientation, such that if one element is over another it is still functionally over if the entire stack is flipped upside down. As such, the terms "over", "under", and "on" are functionally equivalent and do not require the elements to be in contact, and additionally do not prohibit the existence of intervening layers within a structure. The term "adjacent" is used herein in a broad sense to mean an element next to or adjoining another element.

The embodiments of the present invention relate to thin film transistors (TFTs) with different architectures and configurations, including variable dielectric layer thickness, which can all be formed on a common substrate. The ability to easily fabricate multiple types of transistors on a common substrate allows for freedom in circuit design. The ability to control spatially the dielectric layer thickness provides a means for adding extra protection against shorting, reduced capacitance, and the use of dielectric layer thickness to size the various TFTs in a circuit, in addition to the commonly used channel dimensions, width (W) and length (L). Two types of TFTs are useful in circuit design: enhancement-mode and depletion-mode devices. An enhancement-mode transistor is a transistor in which there is negligible off-current flow, relative to on-current flow, between a source and a drain at zero gate voltage; typically, off-current values of metal oxide TFTs are less than $10^{-8}$ A, often as low as $10^{-11}$ A. In other words, the transistor device is normally "off." In contrast, a depletion-mode transistor is normally on meaning that more than a substantially negligible current flows between a source and a drain at zero gate voltage.

The term "vertical transistor" as used herein refers to transistors where the source and drain that define a single channel are at two different distances from the substrate surface (as measured orthogonal to the substrate). This arrangement results in vertical transistors where at least a portion of the channel is vertically oriented with respect to the substrate, which is to say not parallel to the top surface of the substrate. The vertical transistors of the present invention are vertical thin-film transistors, and can be referred to by the acronym "VTFT." Vertical transistors of the present invention include those with portions of their channels in an arrangement that is parallel to the substrate surface, as long as they also have a portion which is not parallel. The advantage of VTFTs in circuit design is their short channel lengths, typically much shorter than that is easily obtainable by techniques to form standard thin film planar transistors.

As used herein, a long channel vertical transistor is a vertical transistor whose channel length is more typical of that of a planar thin film transistor, and therefore long for a transistor having a vertical architecture. Long channel vertical transistors have source and drain electrodes that are at different distances from the substrate (making it a vertical transistor), but the majority of the semiconductor channel is parallel to the substrate. Long channel vertical transistors have advantages over both planar and vertical transistors in designs where the integration of short channel (typical VTFTs) and longer channel TFTs is desired. The ability to use a portion of the vertical-support-element in the longer channel vertical TFT construction allows for the reduction of circuit footprint over mixed vertical and true planar TFTs.

The term "planar transistor" as used herein refers to transistors where the source and drain electrodes which define a single channel are at the same distance from the substrate surface (as measured orthogonal to the substrate). This arrangement results in planar transistors where the channel is parallel to the substrate surface.

Transistors of the present invention are useful in building logic gates. The term "logic gate" has the commonly understood definition. Logic gates include the AND, OR, NOT, NAND, NOR, EXOR and EXNOR gates. A NOT gate is also called an inverter, and is referred to as such herein. Although the inverter is used as a representative logic gate to describe how the transistors geometries of the present invention can be useful in circuits, it should be understood that the transistor architectures of the present invention are equally useful in constructing other types of logic gates.

The particular process sequence for fabricating inorganic thin film transistors and electronic devices from semiconductor, dielectric, conductive materials is determined by the structure of the desired transistor. There are four primary useful structures for thin-film transistors. In the fabrication of a field effect transistor having a so-called inverted structure, a gate electrode can be first deposited on a substrate, for example a vacuum- or solution-deposited metal or organic conductor, or an ALD-deposited conductor. The gate electrode is insulated with a dielectric (often referred to as the gate dielectric), then source and drain electrodes and a layer of the inorganic semiconductor material are applied on top, such that the source and drain electrodes define the length of the channel for the transistor; this source and drain contact geometry is referred to as coplanar. Alternatively, in a second structure, a gate electrode is deposited first, followed by a gate dielectric, the semiconductor is then applied, and finally the contacts for the source electrode and drain electrode are deposited on the semiconductor layer, again defining the length of the channel for the transistor, and resulting in a staggered contact geometry. These transistors where the gate is between the semiconductor layer (semiconductor channel) and the substrate, sometimes referred to as "inverted", are referred to as "bottom-gate" transistors herein.

In an alternative third structure, the source and drain electrodes are deposited first, then the semiconductor is deposited, and finally the dielectric and gate electrode are deposited on top—resulting in a staggered contact geometry. In an alternative fourth structure, the semiconductor is deposited first, prior to depositing the source and drain electrodes—resulting in a coplanar contact geometry. These transistors where the gate is on the side of the semiconductor opposite the substrate, are referred to as "top-gate" transistors herein.

In most embodiments, a field effect transistor includes an insulating layer, a gate electrode, a semiconductor layer including an inorganic material as described herein, a source electrode, and a drain electrode, wherein the insulating layer, the gate electrode, the semiconductor layer, the source electrode, and the drain electrode are in any sequence as long as the gate electrode and the semiconductor layer contact opposite sides of the insulating layer and the source electrode and the drain electrode both contact the semiconductor layer. Both planar and vertical transistors can have bottom- or top-gate architectures, with staggered or coplanar contacts. In the case of a vertical top-gate transistor, the gate is on the side of the semiconductor opposite the vertical-support-element. Both planar and vertical transistors can be designed to operate in either enhancement-mode or depletion-mode.

The vertical transistors of the present invention are formed using a vertical-support-element. As used herein, the vertical-support-element can be any structure which has a perimeter having a reentrant profile. The vertical-support-element can be uniform in material composition, or be formed of multiple materials. The vertical-support-element can also be referred to as a post, as long as the post has the required reentrant profile. The vertical-support-element can be formed using a post and cap, where the cap extends beyond the wall of the post to define the reentrant profile. The vertical-support-element has a height extending away from the substrate. Preferably, the height dimension of the vertical-support-element is less than 10 microns. Commonly-assigned U.S. Pat. No. 9,117,914, U.S. Pat. No. 9,129,993, U.S. Pat. No. 9,147,770, U.S. Pat. No. 9,198,283, U.S. Pat. No. 9,202,898, U.S. Pat. No. 9,236,486, and U.S. Patent Application Publication 2015/0257283, each of which is included herein by reference, are all related to devices containing, and methods of forming, vertical-support-elements using structural polymer posts with an inorganic thin-film cap. The vertical-support-element can be formed from any material, including both conductive and insulating materials. In preferred embodiments, the vertical-support-element is an insulating structure, that is to say is formed from insulating or dielectric materials.

The vertical-support-elements of the present invention can have any shape in the x-y plane parallel to the substrate, as long as the perimeter has a reentrant profile when viewed in cross-section (z-dimension). The vertical-support-element is on substrate, and extends away from the substrate and has a perimeter over the substrate. In preferred embodiments, the vertical-support-element has a reentrant profile around the extent of the perimeter. Alternative embodiments of the present invention include vertical support elements with perimeters having regions with a reentrant profile and regions without a reentrant profile. Embodiments of the present invention have three or more vertical transistors (VTFTs) positioned around the perimeter of the vertical-support-element, each of the transistors having a semiconductor channel being located in a corresponding region of the reentrant profile. The vertical support elements can be any size (x-y) necessary for the design of the circuit.

In some embodiments, the vertical-support-element of the present invention can be a structural polymer. The phrase "structural polymer" as used herein refers to the polymeric material used in the formation of the vertical-support-element, including the polymer post, and is additionally useful to distinguish the structural polymer material from other polymeric materials or polymer layers that may be used in the process. The structural polymer is a polymer that is stable in the final application, and a wide variety of structural polymers may be used. Illustrative of structural polymers are polyesters, polyetheresters, polyamides, polyesteramides, polyurethanes, polyimides, polyetherimides, polyureas, polyamideimides, polyphenyleneoxides, phenoxy resins, epoxy resins, polyolefins, polyacrylates, polyethylene-co-vinyl alcohols (EVOH), and the like, or their combinations and blends. The preferred structural polymers are epoxy resins and polyimides. The structural polymer can be a thermoplastic polymer. The polymer can be a curable composition, including either thermal or radiation curable composition. The polymer does not need to be radiation curable or photosensitive, but photosensitive formulations are useful in the present invention so long as the final cured polymer layer has the structural and mechanical properties required in the final application.

The process of making the vertical thin film transistors of the present invention can be carried out below a support temperature of about 300° C., more preferably below 250° C., or even at temperatures around room temperature (about 25° C. to 70° C.). These temperatures are well below traditional integrated circuit and semiconductor processing temperatures, which enable the use of any of a variety of relatively inexpensive supports, such as flexible polymeric supports. Thus, embodiments of the invention enable production of relatively inexpensive devices on flexible substrates without the need for photolithography and enable rapid pattern changes due to printing the patterns.

The substrates used in the present invention can be any material that acts as a mechanical support for the subsequently coated layers. The substrate can include a rigid material such as glass, silicon, or metals. Useful substrate materials include organic or inorganic materials. Flexible supports or substrates can also be used in the present invention. Nominally rigid materials that are flexible due to their thinness may also be used. These include glass at thicknesses below 200 µm and metals at thicknesses below 500 µm.

The substrate can be bare, indicating that it contains no substantial materials on its surface other the material from which it is composed. The substrate can alternatively include various layers on the surface. These layers include subbing layers, adhesion layers, release layers, wetting layers, hydrophilic layers, and hydrophobic layers. The substrate surface can be treated in order to promote various properties. These treatments include plasma treatments, corona discharge treatments, and chemical treatments.

The substrate can also include on its surface patterned materials. These patterns can include patterns that modulate light transmission or electrical conductivity within or on the substrate. The patterns can include complete devices, circuits, or active elements existing on the substrate. The patterns can include portions of devices, circuits, or active elements awaiting subsequent processing steps for completion.

The thin-film transistors of the present invention are composed of dielectric, semiconductor and conductor materials. In preferred embodiments of the present invention the dielectric, semiconductor and conductor materials are inorganic thin films. A dielectric material is any material that is a poor conductor of electricity. Such materials typically exhibit a bulk resistivity greater than $10^{10}$ Ω-cm. Examples of dielectrics are $SiO_2$, HfO, ZrO, $Si_xN_y$, and $Al_2O_3$. A semiconductor is a material in which electrical charges can move, but in which the concentration of electrical charges can be substantially modulated by external factors such as electrical fields, temperature, or injection of electrical charges from a neighboring material. Examples of semiconductors include silicon, germanium, and gallium arsenide. Particularly preferred semiconductors are zinc oxide-based semiconductors including, zinc oxide, indium zinc oxide, and gallium indium zinc oxide. The semiconductors can be doped to render them n-type or p-type, or to modulate the number of charge carriers present. Conductors of the present invention include metals, such as Al, Ag, Au, Cr, Mo, or In and inorganic conducting oxides, such as indium-doped tin oxide (ITO) or aluminum-doped zinc oxide (AZO).

The dielectric and semiconductor inorganic materials layers of the vertical transistors of the present invention are conformal, and are preferably deposited using an atomic layer deposition (ALD) process. ALD is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed from the vacuum chamber. A second precursor is then applied to react with the first precursor on the substrate. The excess of the second precursor is removed from the vacuum chamber and the process is repeated.

Recently, a new ALD process called spatial atomic layer deposition has been developed which negates the need for a vacuum chamber. This process, commonly referred to as S-ALD or SALD, is described in commonly-assigned U.S. Pat. No. 7,413,982, U.S. Pat. No. 7,456,429, U.S. Pat. No. 7,789,961, and U.S. Patent Application Publication 2009/0130858, each of which are incorporated herein by reference. SALD produces coatings with thicknesses that can be considered consistent, uniform, or even exact. SALD produces coatings that can be considered conformal, or even highly conformal, material layers. SALD is also compatible with a low temperature coating environment. Additionally, SALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, SALD is well suited for manufacturing the present invention.

The preferred process of the present invention employs SALD, a continuous spatially dependent ALD (as opposed to pulsed or time dependent ALD). The process of the present invention allows operation at atmospheric or near-atmospheric pressures and is capable of operating in an unsealed or open-air environment. The process of the present invention is adapted such that material is deposited only in selected areas of a substrate.

Example embodiments of the present invention can be fabricated using selective area deposition (SAD) in combination with ALD. SAD employs a patterned material referred to as a "deposition inhibitor material," "deposition inhibiting material," or simply an "inhibitor," that inhibits the growth of a thin film material on the substrate when the substrate is subjected to an atomic layer deposition. The deposition only deposits in regions (selective areas) of the substrate where the inhibitor is not present. The phrase "deposition inhibitor material" and its equivalents refer herein to any material on the substrate that inhibits the deposition of material during ALD. The "deposition inhibitor material" includes the material applied to the substrate, as well as the material resulting from any optionally subsequent crosslinking or other reaction that modifies the material that may occur prior to depositing an inorganic thin film on the substrate by atomic layer deposition. A polymeric deposition inhibitor material may be crosslinked after applying the polymer onto the substrate, before or during the pattering step.

As discussed above, SAD employs a patterned material referred to as a "deposition inhibitor material" which inhibits the growth of a thin film material on the substrate when the substrate is subjected to an atomic layer deposition. The deposition inhibitor material can be a compound or polymer that, after being applied, is subsequently polymerized, cross-linked, or polymerized and cross-linked.

The deposition of the deposition inhibitor material can be in a patterned manner, such as using inkjet, flexography, gravure printing, microcontact printing, offset lithography, patch coating, screen printing, or transfer from a donor sheet. In alternative embodiments, a uniform layer of the deposition inhibitor material can be deposited and then patterned to form a patterned layer of the deposition inhibitor material. The active inhibiting material may be suspended or dissolved in a solvent or vehicle.

In some applications it is desirable to have a polymer dielectric having the same pattern as the polymer inhibitor used to pattern an ALD deposited inorganic thin film layer. In these applications, the polymer inhibitor is selected to advantageously have inhibitor properties and dielectric properties, as well as mechanical properties such that the polymer is stable in the final structure and application. When the polymer inhibitor is coated with another polymer dielectric layer it may not be necessary to modify the polymer inhibitor surface. In some embodiments, however, the polymer inhibitor is a switchable polymer inhibitor. A switchable polymer inhibitor is a polymer that as deposited, or as patterned, inhibits ALD growth of inorganic thin films. Upon subjecting the switchable polymer inhibitor to a suitable treatment, the polymer loses its inhibition properties and the ALD is now able to nucleate on the polymer surface. Suitable treatments include high energy oxygen processes, such as oxygen plasmas and UV-ozone treatments. Preferred switchable polymer inhibitors include epoxy resins (such as SU-8), organosiloxanes (such as PDMS), and polyvinyl pyrrolidone.

In some embodiments, the deposition inhibitor material can be used in the reentrant profile of the vertical-support-element to prevent the growth thin-film material inside the reentrant profile. Deposition inhibitor in the reentrant profile can be used to pattern a conformal conductive layer, such as a conductive metal oxide, the resulting in two vertically spaced apart electrodes. Commonly assigned U.S. Pat. No. 9,093,470, U.S. Pat. No. 9,123,815, U.S. Pat. No. 9,142,647, and U.S. Pat. No. 9,214,560, each of which is incorporated herein by reference, describe the formation of vertical transistors using selective area deposition to define the source and drain. As described, the deposition inhibitor can be patterned via exposure (photo-lithographically), or by printing. When the deposition inhibitor is applied via printing, patterns can be designed such that the inhibitor wicks (moves by capillary action) along the reentrant profile of the vertical-support-element. Previously cited U.S. Pat. No. 9,117,914 describes the use selective area deposition to form vertically separated electrodes over an insulating vertical-support-element formed from a structural polymer post and an inorganic cap.

In accordance with the present invention, an electronic element comprises a substrate and a vertical-support-element located on the substrate. The vertical-support-element extends away from the substrate and has a perimeter over the substrate, and the vertical-support-element has a reentrant profile around the extent of the perimeter. Three or more vertical transistors are positioned around the perimeter of the vertical-support-element. Each of the transistors has a semiconductor channel that is located in a corresponding region of the reentrant profile.

Figure 1B:
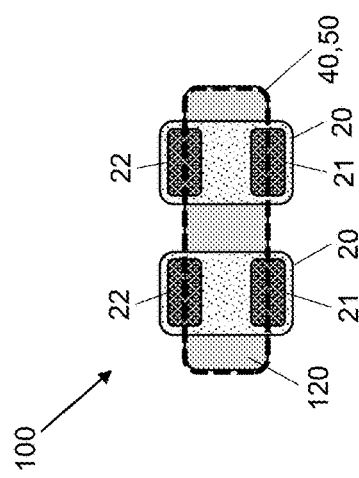
Figure 1A:
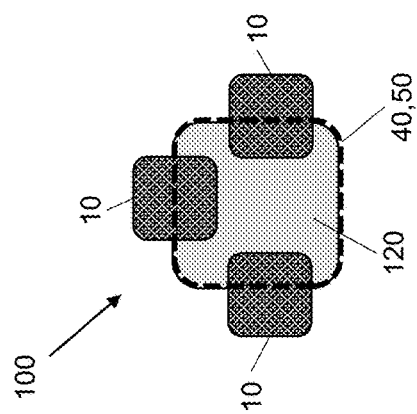

Turning now to the figures, schematic illustrations are shown in FIGS. 1a-1c of electronic elements 100 of the present invention having three or more vertical thin-film transistors (VTFTs) on a common vertical-support element 120. The vertical-support-elements 120 in FIGS. 1a-1c each has a perimeter 40 having a reentrant profile 50. As used herein, the term "perimeter" has the commonly accepted meaning, and should be considered to be the continuous boundary of a closed geometric object, such as vertical-support-element 120. The term "reentrant profile" will be defined in more detail below with respect to the discussion of FIGS. 4a-4f. The vertical-support-element 120 can have any geometric shape desired to meet the needs of the electronic element 100.

FIG. 1a illustrates an embodiment of the present invention where electronic element 100 includes three vertical transistors 10 (VTFTSs) that are independently operable. Each vertical transistor 10 is illustrated as crossing the perimeter of the vertical-support-structure 120, and thus can be understood to have one source or drain electrode on top of the vertical-support-structure 120, and one drain or source electrode on the substrate and not on the vertical-support-structure 120. As used herein, the phrase "independently operable" does not imply that vertical transistor 10 is not connected into a larger electronic circuit, but rather is used indicate that each vertical transistor 10 is a single VTFT having a single continuous semiconductor channel within a continuous region of the reentrant profile 50 having corresponding source, drain and gate electrodes. Independently-operable vertical transistor 10 has one of the source/drain electrode at the level of the substrate and one over the top of the vertical-support-element 120. The gate electrode of vertical transistor 10 has at least a portion that is located within the reentrant profile 50. The gate electrode can be configured such that electrical contact to adjacent transistors or other electronic components can be made either at the level of the substrate or over the top of the vertical-support-element 120.

FIG. 1b illustrates an embodiment of the present invention where electronic element 100 includes two series-connected vertical transistor pairs 20. As shown, each series-connected vertical transistor pair 20 including a first vertical transistor 21 having a first semiconductor channel and a second vertical transistor 22 having a second semiconductor channel. The series-connected vertical transistor pairs 20 share an electrically common gate electrode; stated another way, the first vertical transistor 21 and the second vertical transistor 22 have a common gate electrode. The schematic diagram uses a larger shaded rectangular shape enclosing the series-connected vertical transistor pairs 20 for identification. In the configuration shown in FIG. 1b, the first and second vertical transistors 21, 22 in each series-connected vertical transistor pair 20 are formed across from each other, on opposite sides of a portion of, the vertical-support element 120. The electrical connections to each series-connected vertical transistor pair 20 are at the level of the substrate, with the source (or drain) of the first vertical transistor 21 being on one side of the vertical-support element 120 and the drain (or source) of the second vertical transistor 22 being on the opposite side of the vertical-support-element 120. The first and second vertical transistors 21, 22 are connected in series over the top of the vertical-support-element 120. The electrically common gate extends over the vertical-support-element 120 and has portions that are located within the portion of the reentrant profile 50 corresponding to the location of each of the vertical transistors 21, 22. Each series-connected vertical transistor pair 20 illustrated in FIG. 1b can be electrically connected into a larger electronic element. The electrically common gate electrode can be configured such that electrical contact to adjacent transistors or other electronic components can be made over the top of the vertical-support element 120, or at the level of the substrate on either side of the vertical-support-element 120, and will be determined by the requirements of the overall circuit layout.

FIG. 1c illustrates an embodiment of the present invention where electronic element 100 includes an independently-operable vertical transistor 10 together with a series-connected vertical transistor pair 20. The series connected vertical transistor pair 20 include a first vertical transistor 21 having a first semiconductor channel and a second vertical transistor 22 having a second semiconductor channel. The first vertical transistor 21 and the second vertical transistor 22 have an electrically common gate electrode. The series-connected vertical transistor pair 20 is the same as illustrated in FIG. 1b, and should be understood from the previous description. Similarly, the form of the independently-operable vertical transistor 10 is the same as illustrated in FIG. 1a, and should be understood from the previous description. The vertical-support-element 120 illustrated in FIG. 1c has a semi-circular shape and is used to demonstrate that the shape of the vertical-support-element 120 is not limited to rectangular geometries.

FIGS. 2a-2h illustrate a variety of exemplary geometries for the vertical-support-elements 120 that are included within the scope of the present invention. As shown, the perimeters 40 of the vertical-support-element 120 can include straight-line regions, curved regions or any combination thereof around the perimeter 40. The vertical-support-elements 120 can have an arbitrary shape convenient for easy fabrication of the desired electronic elements 100.

Shapes having an annular arrangement are included within the scope of the present invention as illustrated in FIG. 2a. Annular vertical-support-elements 120 are not restricted to circular geometries, and can include any annular shape where there is an outer perimeter 40a that is larger than an inner perimeter 40b, and where the vertical-support-element 120 is defined by the region between the outer perimeter 40a and inner perimeter 40b. Included are vertical-support-elements 120 where the outer perimeter 40a and the inner perimeter 40b have different shapes, such as an outer perimeter 40a that is substantially circular with an inner perimeter 40b that is substantially rectangular, or vise-versa. In preferred embodiments, both the inner perimeter 40a and the outer perimeter 40b will have a reentrant profile 50.

To better understand the requirements for the vertical-support-element 120, we will turn briefly to FIGS. 4a-4f and FIGS. 5a-5c. The vertical-support-element 120 can have any shape which has a perimeter 40 having a reentrant profile 50. In some embodiments, the vertical-support-element 120 can be formed on substrate 110 from a post 140 and cap 145, preferably a structural polymer post 140 and an inorganic cap 145. The range of useful variants of the reentrant profile 50 formed with a post 140 and cap 145 can be better understood from FIGS. 4a-4f, which each contain a cross-sectional view of a reentrant profile 50 of an exemplary vertical-support-element 120 that has been formed from a post 140 and cap 145. As shown, the reentrant profile 50 can have any shape that is defined by the extension of a cap 145 beyond the edge of post 140. Preferably, the cap 145 extends beyond the edge of the post 140 by a distance that is less than the height of the post 140.

The reentrant profile 50 is defined as the profile that lies within the boundaries of the cap 145, the substrate 110 and a line drawn orthogonal to the substrate from the edge of the cap 145 at the point of furthest extension (as shown by lines P-P' in FIGS. 4a-4f). To aid in understanding, the reentrant profile 50 in each figure is shown in bold. As shown, each reentrant profile 50 has an associated depth, d, which is defined as the maximum extension of the cap from the post, measured parallel to the substrate 110.

FIG. 4a illustrates a simplified profile, consistent with vertical-support-element 120 profile that is used to demonstrate the embodiments of the present invention. As shown in FIGS. 4d and 4f, the cap 145 can have a non-uniform edge profile. FIGS. 4b, 4c, and 4f illustrate embodiments where the edges of the posts 140 are not straight vertical edges orthogonal to the substrate 110. In general, the posts 140 can have any profile as long as the edge does not extend beyond the end of the cap 145. In alternative embodiments, the vertical-support-element 120 can be formed without the use of a separate post 140 and cap 145, in such embodiments it should be understood that the same range of reentrant profiles 50 with similar attributes is included within the scope of the invention.

As illustrated in FIGS. 5a-5c, the vertical-support-element 120 can have any shape which has a height dimension 530 extending away from the substrate 110 to a top 535. The vertical-support-element 120 also has edges along the height dimension, a first side edge 510 including a first portion of the corresponding reentrant profile 50 and a second side edge 520, opposite the first side edge 510, including a second portion of the corresponding reentrant profile 50a. The distance between the first side edge 510 and the second side edge 520 will be determined by the overall size of the vertical-support-element 120. The vertical-support-element 120 has a width 500 at the top 535, and a minimum width 505 between the top 535a and the substrate 110 that is smaller than the corresponding width 500 at the top 535. The reentrant profile 50 is defined as the profile of the vertical-support-element 120 that lies within the boundaries of the top 535 of the vertical-support-element 120, the substrate 110, and a line drawn orthogonal to the substrate 110 from the edge of the top 535 (as shown by lines P-P' in FIGS. 5a-5c). To aid in understanding, the first reentrant profile 50 in each Figure is shown in bold. Additionally, the vertical-support-element 120 can have portions that extend beyond the reentrant profile, as shown in FIG. 5c. The vertical-support-element 120 shown in these figures can be fully formed of insulating materials. FIGS. 5a-5c illustrate reentrant profiles 50, 50a obtainable with either an electrically conductive core or insulating structural polymer core.

Returning to the embodiments of the present invention, FIGS. 3a-3f illustrate embodiments of electronic elements 100 having three or more vertical thin-film transistors (VTFTs) on a common vertical-support element 120. In each figure, there is shown a vertical-support-element 120 having a perimeter 40 with a reentrant profile 50 as was described in relationship to FIGS. 1a-1c. In each embodiment, the exact geometry of each vertical transistor 10, 21, 22 (VTFT) is chosen in accordance with the desired function of the circuit element 100. Vertical transistors 10, 21, 22 can be enhancement-mode transistors or depletion-mode transistors. Vertical transistors 10, 21, 22 can have bottom-gate or top-gate architectures with staggered or coplanar contacts. The architecture of vertical transistor 10, 21, 22 will be determined by the desired operation of the transistor 10, 21, 22 and the fabrication method used to construct the device. Each exemplary electronic element 100 has multiple vertical transistors 10, 21, 22 positioned around the perimeter 40 of the vertical-support-element 120, and for a given electronic element 100 each of the vertical transistors 10, 21, 22 can have the same or different architectures, and can operate in the same or different modes. The different configurations of the vertical transistors 10, 21, 22 will be better understood from description further in this document.

FIGS. 3a, 3b and 3e each illustrate exemplary embodiments having a vertical-support-element 120 with a substantially rectangular perimeter 40 having four edges and at least three vertical transistors 10, 21, 22. As used herein, "substantially rectangular" include shapes having two pairs of approximately parallel sides wherein the corners can be sharp or rounded. In FIG. 3a each of the vertical transistors 10 is formed on one of the edges of the vertical-support-element 120. FIGS. 3a and 3b are similar to the embodiment shown in FIG. 1a, where each vertical transistor 10 in the electronic element 100 is an independently-operable VTFT. FIG. 3e is similar to the embodiment shown in FIG. 1c, and includes both independently-operable vertical transistors 10 and a series-connected vertical transistor pair 20 positioned around a rectangular perimeter 40. These embodiments should be understood from the previous description of FIGS. 1a-1c.

FIG. 3c illustrates three series-connected vertical transistor pairs 20a, 20b, 20c, each having a first vertical transistor 21a, 21b, 21c with a first semiconductor channel and a second vertical transistor 22a, 22b, 22c with a second semiconductor channel. Within each pair, the first vertical transistor 21a, 21b, 21c and the associated second vertical transistor 22a, 22b, 22c have an electrically common gate electrode.

The difference between the series-connected vertical transistor pairs 20a, 20b, 20c in FIG. 3c is in the location of the first vertical transistor 21a, 21b, 21c and second vertical transistor 22a, 22b, 22c around the perimeter 40 of vertical-support-element 120. In the figures, the different shapes enclosing the series-connected vertical transistor pairs 20a, 20b, 20c is used to indicate the different relative transistor locations (i.e., opposite sides, adjacent, adjacent sides). Series-connected vertical transistor pair 20a is analogous to the series-connected vertical transistor pairs 20 shown in FIGS. 1b and 1c, and should be understood from the previous description.

Series-connected vertical transistor pair 20b is configured such that the electrical connections to the series-connected vertical transistor pair 20b are at the level of the substrate, with the source (or drain) of vertical transistor 21b being next to the drain (or source) of vertical transistor 22b on the same side of vertical-support-element 120 in adjacent regions of the reentrant profile 50. Since the vertical-support-element 120 can have any shape, it should be clear that "on the same side" is not meant to indicate on the same straight-line portion, rather that the vertical transistors 21b, 22b are adjacent each other along the perimeter 40 without electronics elements formed between them within the reentrant profile 50. As described in relationship to FIG. 1b, the two vertical transistors 21b, 22b are also connected in series over the top of the vertical-support-element 120. The electrically common gate extends over the vertical-support-element 120 and has portions that are located within the portions of the reentrant profile 50 corresponding to the location of each vertical transistor 21b, 22b of the series-connected vertical transistor pair 20b. The series-connected vertical transistor pair 20b can be electrically connected into a larger electronic element. The electrically common gate electrode can be configured such that electrical contact to adjacent transistors or to other electronic components can be made over the top of the vertical-support element 120, or at the level of the substrate on either side of the vertical-support-element 120, and will be determined by the requirements of the overall circuit layout.

Series-connected vertical transistor pair 20c is configured such that the electrical connections to the series-connected vertical transistor pair 20c are at the level of the substrate, with the source (or drain) of vertical transistor 21c being next to the drain (or source) of vertical transistor 22c on the adjacent sides of vertical-support-element 120. Since the vertical-support-element 120 can have any shape, it should be clear that "adjacent sides" is not restricted to sides which meet at a 90 degree angle, but can include any two adjacent sides of the shape of any given vertical-support-element 120. Like series-connected vertical transistor pair 20b, series-connected vertical transistor pair 20c has first and second transistors 21c and 22c that are adjacent each other along the perimeter 40 without electronics elements formed between them within the reentrant profile 50. The two vertical transistors 21c, 22c are also connected in series over the top of the vertical-support-element 120. The electrically common gate extends over the vertical-support-element 120 and has portions that are located within the portions of the reentrant profile 50 corresponding to the location of each vertical transistor 21c, 22c of the series-connected vertical transistor pair 20c. The series-connected vertical transistor pair 20c can be electrically connected into a larger electronic element. The electrically common gate electrode can be configured such that electrical contact to adjacent transistors or to other electronic components can be made over the top of the vertical-support element 120, or at the level of the substrate on either side of the vertical-support-element 120, and will be determined by the requirements of the overall circuit layout.

The series-connected vertical transistor pairs 20a, 20b, 20c are electrically equivalent, the specific arrangement of each of the vertical transistors 21a, 22a, 21b, 22b, 21c, 22c within each series-connected vertical transistor pair 20a, 20b, 20c will be determined by the specific layout of the electronic elements 100 and the optimal spatial location of the connection to the corresponding electrodes.

FIG. 3d illustrates another exemplary embodiment having two series-connected vertical transistor pairs 20a, 20b, each with a different configuration on a common vertical-support-element 120, together with three independently-operable vertical transistors 10. The individual components should be understood from the previous descriptions, and the example is provided to illustrate that multiple combinations of vertical transistors 10, 21a, 21b, 22a, 22b formed over a common vertical-support-element 120 fall within the scope of this invention, and not all combinations contemplated are illustrated since they should be understood from the subset described herein.

FIG. 3f is another exemplary embodiment having two series-connected vertical transistor pairs 20a, 20b, each with a different configuration on a common vertical-support-element 120, together with three independently-operable vertical transistors 10. The individual components should be understood from the previous descriptions. FIG. 3f includes a vertical-support-element 120 having an external perimeter 40a and an internal perimeter 40b. Both the outer perimeter 40a and the inner perimeter 40b of the vertical-support-element 120 have a corresponding reentrant profile 50a, 50b. Vertical transistors 10, 21a, 21b, 22a, 22b can be formed on vertical-support-element 120 such that their semiconductor channel is along either the outer perimeter 40a or the inner perimeter 40b, with their position being determined by the requirements of the electronic element 100.

To better understand the features of the series-connected vertical transistor pairs 20, consider the representative architectures of FIGS. 6a-9c. As previously stated, series-connected vertical transistor pairs 20 can have any geometry and operation mode that is required by the circuit requirements given that each of the associated vertical transistors 21, 22 has a semiconductor channel that is at least partially within the reentrant profile 50.

Figure 6C:
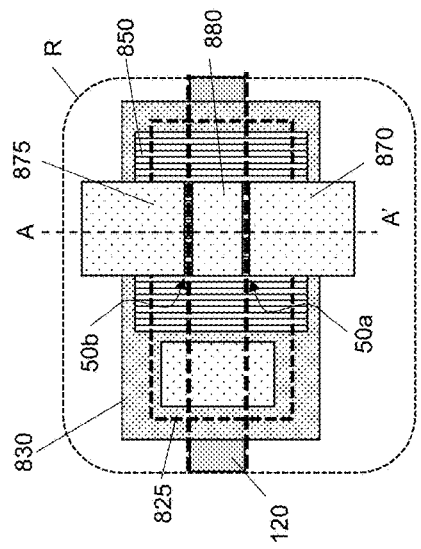
FIGS. 6c and 6d are a plan view and a cross-sectional view, respectively, of a pair of series-connected bottom-gate vertical transistors formed across a portion of a vertical support structure as shown in the schematic illustration of FIG. 6b.
Figure 6D:
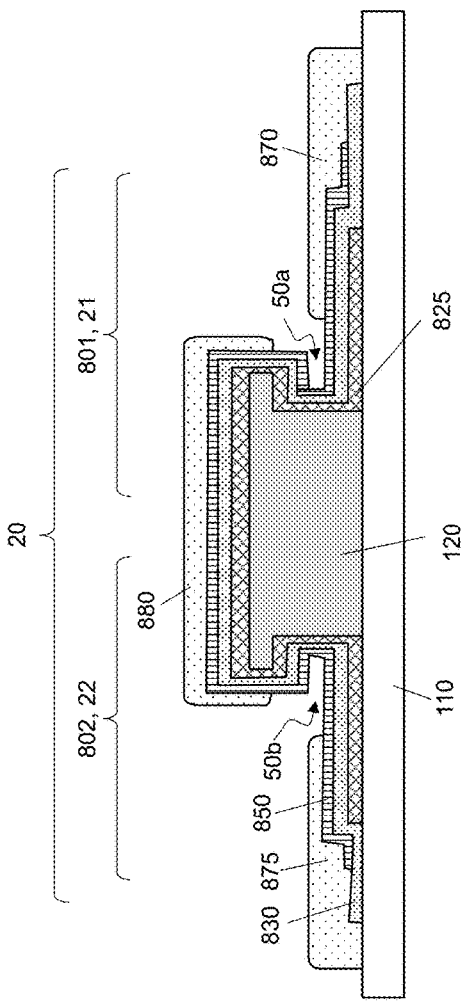
Figure 6A:
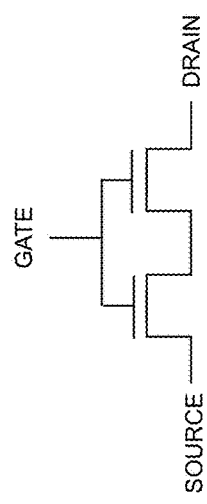
FIG. 6a is a circuit diagram for two transistors connected in series and sharing an electrically common gate electrode.
Figure 6B:
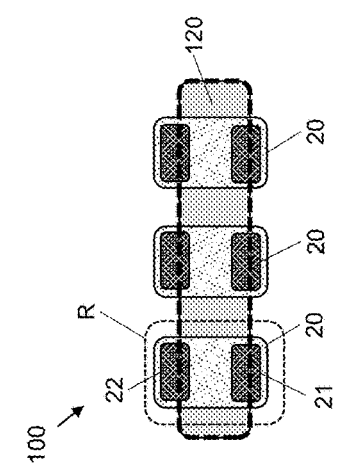

One useful example is a pair of bottom-gate series-connected vertical transistors, which can be understood through the following description of FIGS. 6a-6d. FIG. 6a is the equivalent circuit diagram for two transistors connected in series and sharing an electrically common gate electrode. Previously cited U.S. Pat. No. 9,117,914, describes bottom-gate vertical transistors formed over a polymer post with an inorganic cap. The combination of the polymer post and inorganic cap can be used to form the vertical-support-element 120 of the present invention, and should be understood from the previous description. The schematic illustration in FIG. 6b shows an exemplary embodiment having three series-connected vertical transistor pairs 20 on a common vertical-support-element 120. Region R highlights one series-connected vertical transistor pair 20, containing a first transistor 21 and a second vertical transistor 22. FIG. 6c is a plan view showing a more detailed view of the region R in FIG. 6b. FIG. 6d is a schematic cross-sectional view of bottom-gate vertical transistors 801 and 802, taken along the line A-A' of the plan view shown in FIG. 6c.

As shown in FIG. 6d, bottom-gate vertical transistors 801 and 802 (i.e., vertical transistors 21 and 22) each have a vertical transistor structure, where the vertical portion is defined by the vertical-support-element 120. Gate layer 825 is in contact with at least the side edges of the vertical-support-element 120, dielectric layer 830 is in contact with the gate layer 825, and semiconductor layer 850 is in contact with a first electrode 880. The gate layer 825 provides the electrically common gate electrode, and is present within the portions of reentrant profile 50a, 50b in the channel region of both the first and second vertical transistors 21, 22.

Vertical transistors 21, 22 include a substrate 110 and a vertical-support-element 120, which should be understood from the previous descriptions. A conformal conductive layer forms the gate layer 825 on the side edges of the vertical-support-element 120 in the reentrant profiles 50a, 50b and over at least a portion of the substrate 110 not over the vertical-support-element 120. As shown in FIG. 6d, the gate layer 825 conformally covers the top of the vertical-support-element 120 and the portions of the reentrant profile 50a, 50b in the channel region of both vertical transistors 21, 22, and is also in contact with the substrate 110. The insulating dielectric layer 830 conforms to the reentrant profile 50a, 50b of vertical transistors 21, 22. Dielectric layer 830 can be said to coat and maintain the reentrant profile 50a, 50b, and is in contact with the gate layer 825. Dielectric layer 830 is a conformal insulating material layer. Semiconductor layer 850 also conforms to the reentrant profiles 50a, 50b of the vertical transistors 21, 22 and maintains the shape, and is in contact with the dielectric layer 830. Semiconductor layer 850 is a conformal semiconductor material layer. As illustrated in FIGS. 6c and 6d, the semiconductor layer 850 is patterned to be a common region for vertical transistors 21, 22. In alternative embodiments the semiconductor layer 850 could have separate regions for vertical transistors 21, 22.

The source and drain have conventionally accepted meanings, and either the first electrode 880 or second electrode 870 can be designated the source (or drain) as is required by the application or circuit for vertical transistor 21; similarly, either the first electrode 880 or third electrode 875 can be the source/drain for vertical transistors 22. As should be understood from the equivalent circuit diagram in FIG. 6a, first electrode 880 will function as the source for one of the vertical transistors 21, 22 and the drain for the other of the vertical transistors 21, 22. The first electrode 880, second electrode 870 and third electrode 875 can be a single conductive material, as shown, or may include any number of conductive material layers. The first electrode 880 is located in contact with a first portion of the semiconductor layer 850 over the top of the vertical-support-element 120. The second electrode 870 is located in contact with a second portion of the semiconductor layer 850 over the substrate 110 and not over the vertical-support-element 120, as shown in FIG. 6d. The first electrode 880 and second electrode 870 define a first channel in the semiconductor layer 850 between the first electrode 880 and second electrode 870 for the vertical transistor 21. Similarly, the first electrode 880 and third electrode 875 define a second channel in the semiconductor layer 850 between the first electrode 880 and second electrode 870 for the vertical transistor 22. As shown, vertical transistors 21, 22 have a common gate and are formed in series, and their function should be understood from the description of the equivalent circuit diagram of FIG. 6a.

FIGS. 7a-7b illustrate an alternative embodiment of a series-connected vertical transistor pair 20b including bottom-gate vertical transistors 801, 802 having a common gate, formed over a common vertical-support-structure 120. The elements of the series-connected vertical transistor pair 20b are analogous to those of the series connected vertical transistor pair 20 of FIGS. 6a-6d. Region R of FIG. 7a highlights one series connected vertical transistor pair 20b, containing first vertical transistor 21b and second vertical transistor 22b.

FIG. 7b is a top-view of region R of FIG. 7a. The gate layer 825, semiconductor layer 850, dielectric layer 830, first electrode 880, second electrode 870, and third electrode 875 have the same function and attributes as described with respect to FIGS. 6c and 6d, and should be understood from the previous description. As shown, the first electrode 880 is located in contact with a first portion of the semiconductor layer 850 over the top of the vertical-support-element 120. The second electrode 870 and the third electrode are located in contact with portions of the semiconductor layer 850 over the substrate 110 and not over the vertical-support-element 120. Having the contacts for the pair of series-connected vertical transistor pair 20b at the level of the substrate 110 facilitates electrical connections within larger circuit element. In the embodiment shown in FIGS. 7a-7b, the vertical transistor 21a, 21b are positioned on the same side of the vertical-support-structure 120 in adjacent regions of the reentrant profile 50. As shown, vertical transistor 21a, 21b have a common gate and are formed in series, and their function should be understood from the description of equivalent circuit diagram of FIG. 6a.

In alternative embodiments, the first electrode 880 can be formed at the level of the substrate (not over the vertical-support-element 120), and the second electrode 870 and third electrode 875 can be located over the vertical-support-element 120. This alternative arrangement can be used to facilitate electrical connections over the vertical-support-element 120 to other circuit elements. As with the embodiment shown in FIG. 7b, this alternative arrangement has the first electrode 880 at a different distance from the substrate 110 than both the second and third electrodes 870, 875, and the first and second vertical transistors 21b,22b have their channels located in respective portions of the reentrant profile 50.

FIGS. 8a-8b illustrate another embodiment of a series-connected vertical transistor pair 20c including bottom-gate vertical transistors 801, 802 having a common gate, formed over a common vertical-support-structure 120. The elements of the series-connected vertical transistor pair 20c are analogous to those of the series connected vertical transistor pair 20 of FIGS. 6a-6d. Region R of FIG. 8a highlights one series-connected vertical transistor pair 20c, containing first vertical transistor 21c and second vertical transistor 22c.

FIG. 8b is a top-view of region R of FIG. 8a. The gate layer 825, semiconductor layer 850, dielectric layer 830, first electrode 880, second electrode 870, and third electrode 875 have the same function and attributes as described with respect to FIGS. 6c and 6d, and should be understood from the previous description. As shown, the first electrode 880 is located in contact with a first portion of the semiconductor layer 850 over the top of the vertical-support-element 120. The second electrode 870 and the third electrode 875 are located in contact with portions of the semiconductor layer 850 over the substrate 110 and not over the vertical-support-element 120. Having the contacts for the series-connected vertical transistor pair 20b at the level of the substrate 110 facilitates electrical connections within larger circuit element. In the embodiment shown in FIGS. 8a-8b, the first vertical transistor 21c and the second vertical transistor 22c in the series-connected vertical transistor pair 20c are positioned on adjacent sides of the vertical-support-structure 120. As shown, vertical transistors 21c, 22c have a common gate and are formed in series, and their function should be understood from the description of the equivalent circuit diagram of FIG. 6a.

FIGS. 6a-8b illustrate bottom-gate architectures for the series-connected vertical transistor pairs 20. As described earlier, the series-connected vertical transistor pairs 20 can also have a top-gate architecture. Series-connected vertical transistor pairs 20 having a top-gate transistor architecture have analogous features to those described with respect to the bottom-gate transistors, with the location of the gate layer relative to the vertical-support-element 120 being the primary difference. All three arrangements illustrated in FIGS. 6a through 8b have top-gate analogs. For clarity of understanding, the top-gate analog of the embodiment shown in FIGS. 6a through 6d will be examined in more detail.

Figure 9B:
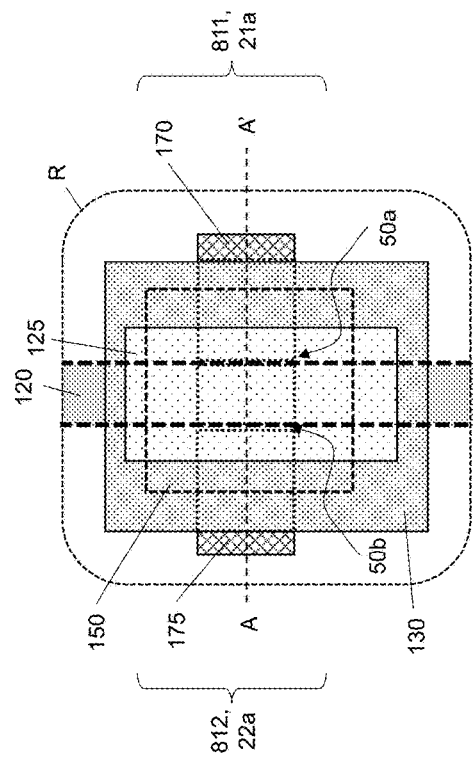
Figure 9A:
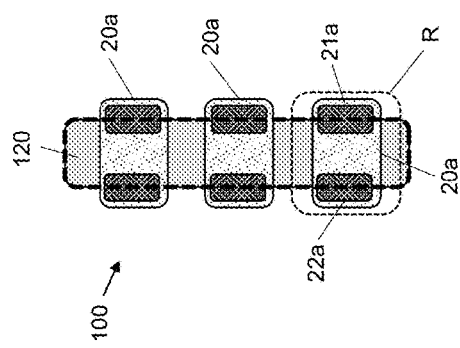
FIG. 9a is a schematic illustration showing an exemplary embodiment of the present invention having three series-connected vertical transistor pairs.
Figure 9C:
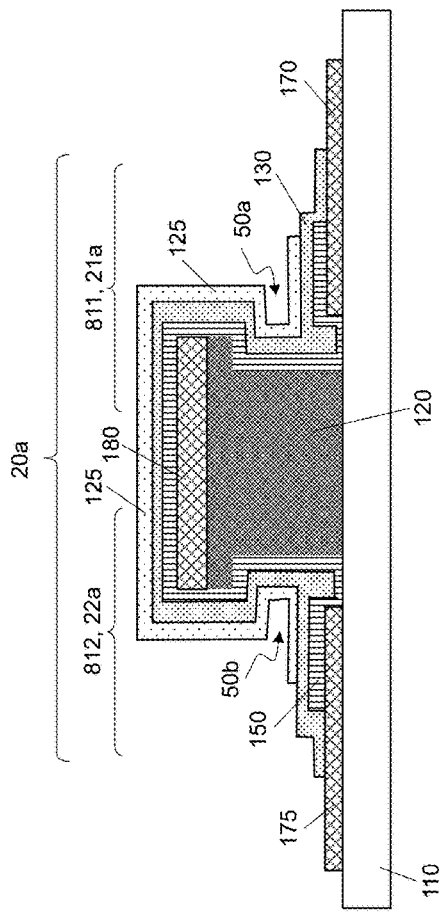

The schematic illustration in FIG. 9a shows an exemplary embodiment of the present invention having three series-connected vertical transistor pairs 20a on a common vertical-support-element 120. Region R highlights one series-connected vertical transistor pair 20a, containing a first transistor 21a and a second vertical transistor 22a. FIG. 9b is a plan view showing a more detailed view of the region R in FIG. 9a, where the vertical transistors 21a, 22a are top-gate vertical transistors 811, 812. FIG. 9c is a schematic cross-sectional view of top-gate vertical transistors 811 and 822, taken along the line A-A' of the plan view shown in FIG. 9b. The series-connected vertical transistor pair 20a shown in FIGS. 9a-c operates as illustrated in the equivalent circuit of FIG. 6a. U.S. patent application Ser. No. 14/737,549 describes top-gate vertical transistors formed over a polymer post with an inorganic cap. The combination of the polymer post and inorganic cap can be used to form the vertical-support-element 120 of the present invention, and should be understood from the previous description.

The electronic device 100 shown in FIGS. 9a-9c, has vertical transistors 21a, 22a on a substrate 110, where each a vertical portion of each of the vertical transistors 21a, 22a is defined by the vertical-support-element 120 (also sometimes called a post structure herein). The vertical-support-element 120 is on the substrate 110, and the vertical-support-element 120 extends away from the substrate 110 to a top. The vertical-support-element 120 includes a first side edge having a first reentrant profile 50a and a second side edge having a second reentrant profile 50b.

Conformal semiconductor layer 150 conforms to the reentrant profiles 50a, 50b of the vertical transistors 21a, 22a and maintains the shape, and is in contact with the vertical-support-element 120 in the reentrant profiles 50a, 50b. Semiconductor layer 150 is a conformal semiconductor material layer. Preferably the semiconductor layer 150 is a thin film inorganic semiconductor material layer. Dielectric layer 130 conforms to the reentrant profiles 50a, 50b, and is in contact with the semiconductor layer 150. Dielectric layer 130 can be said to coat and maintain the reentrant profiles 50a, 50b. The dielectric layer 130 is a conformal insulating material layer. Dielectric layer 130 is often referred to as a dielectric material layer or an insulating layer, and can be formed of a single material layer or multiple dielectric material layers (multi-layer dielectric stack). Preferably the dielectric layer 130 is a thin film inorganic dielectric material layer.

Conductive conformal gate layer 125 is on the dielectric layer 130 in the reentrant profiles 50a, 50b. The gate layer 125 is on the side of the semiconductor layer 150 opposite the vertical-support-element 120, and can be said to be a top-gate. The gate layer 125 can be a single conductive material, as shown in FIG. 9a, or can comprise any number of conductive material layers. The gate layer 125 is preferably a conductive metal oxide material.

Vertical transistors 21a, 22a are formed over a single post structure, and are connected in series, and share a common gate. The first electrode 180, second electrode 170 and third electrode 175 can be a single conductive material, as shown in FIG. 9c, or can comprise any number of conductive material layers. As shown in FIGS. 9b and 9c, the first, second and third electrodes 180, 170, 175 serve as the source and drain electrodes for the top-gate vertical transistors 21a, 22a. Source and drain have conventionally accepted meanings. For top-gate vertical transistor 21a, either the first electrode 180 or the second electrode 170 can be designated the source (or drain) as is required by the application or circuit. The first electrode 180 is located in contact with a first portion of the semiconductor layer 150 over the top of the vertical-support-element 120. As shown in FIG. 9c, the first electrode 180 can also be in contact with the top of the vertical-support-element 120. The second electrode 170 electrode is located in contact with a second portion of the semiconductor layer 150 over the substrate 110 and not over the vertical-support-element 120. Likewise, the third electrode 175 electrode is located in contact with a third portion of the semiconductor layer 150 over the substrate 110 and not over the vertical-support-element 120. The distance between the first electrode 180 and second electrode 170, and the distance between the first electrode 180 and third electrode 175, are both greater than zero when measured orthogonal to the substrate surface. The configuration shown in FIGS. 9a-c allows contact to the vertical transistors 21a, 22a to be made on the substrate level so the vertical transistors 21a, 22a are operated in series, rather than making connection at the top of the vertical-support-element 120. The first electrode 180 and second electrode 170 define the semiconductor channel of the vertical transistor 21a, where semiconductor channel has the conventionally accepted meaning, and is in the semiconductor layer 150 between the first electrode 180 and second electrode 170. Similarly, the first electrode 180 and third electrode 175 define the semiconductor channel of the vertical transistor 22a, where semiconductor channel is in the semiconductor layer 150 between the first electrode 180 and third electrode 175.

The reentrant profiles 50a, 50b of vertical transistors 21a, 22a allow a dimension of the corresponding semiconductor channels to be associated with the thickness of the vertical-support-element 120, which is defined by the height of the vertical-support-element 120. Advantageously, this architecture of the present invention reduces reliance on high resolution or very fine alignment features during the manufacture of transistors that include short channels. Furthermore, the separation of the first electrode 180 and second electrode 170 is primarily determined by the reentrant profiles 50a, 50b in the vertical-support-element 120. Additionally, the first electrode 180, second electrode 170 and the third electrode 175 can be formed simultaneously and have the same material composition and layer thickness.

In some embodiments, the source and drain electrodes of the vertical transistors 21a, 22a make contact with the opposite side of the semiconductor layer than shown in FIG. 9c, and have a top-gate coplanar geometry. In this geometry, as with that shown, the first electrode 180 is over the vertical-support-element 120 and in contact with the semiconductor layer 150 and the second electrode 170 is adjacent to the first reentrant profile 50a, and in contact with a second portion of the semiconductor layer 150 located over the substrate 110 and not over the vertical-support-element 120. In all cases, the position of the electrodes and the semiconductor layer are a consequence of the fabrication process. In some embodiments it is preferable to deposit the conformal semiconductor layer 150 prior to depositing the first, second and third electrodes 180, 170, 175.

In some embodiments, an optional second conformal dielectric layer (not shown) is present that conformally covers the vertical-support-element 120 and at least a portion of the substrate 110. This second conformal dielectric layer is located at least between the semiconductor layer 150 and the vertical-support-element 120. In these embodiments, the second conformal dielectric material layer can be used to encapsulate the polymer post and cap used to form the vertical-support-element 120, and can provide a single material surface for building the vertical transistors of the present invention. The addition of a second conformal dielectric material layer can be used to avoid issues of non-uniform nucleation or thin film growth on the vertical-support-element 120 and substrate surfaces 110. Preferably the second conformal dielectric material layer is an inorganic thin film dielectric material layer, which is preferably deposited using ALD due to the conformal nature of the ALD process.

To better understand the features of independently-operable vertical transistors 10, consider the representative architectures illustrated in FIGS. 10a-10c. As previously stated, the independently-operable vertical transistors 10 can have any geometry and operation mode that is required by the circuit requirements given that the vertical transistor 10 has a semiconductor channel within the reentrant profile 50. FIG. 10a is a schematic illustration of an exemplary embodiment of the present invention including four independently-operable vertical transistors 10, 10a, 10b formed on a common vertical-support-element 120, together with a series-connected vertical transistor pair 20. Region R highlights two independently-operable vertical transistors 10a and 10b, which are shown in a more detailed plan view in FIG. 10b. FIG. 10c is a cross-sectional view of FIG. 10b taken along the line A-A'. As shown in FIGS. 10b and 10c, vertical transistor 10a is a top-gate vertical transistor 303 and vertical transistor 10b is a bottom-gate vertical transistor 803, both of which are embodiments of independently-operable vertical transistors 10 in accordance with the present invention. For simplicity of illustration they are shown disposed across from each other on opposite sides of vertical-support-element 120, however it should be understood that they could be positioned anywhere along the perimeter 40 of vertical-support-structure 120 so long as their channels are within the reentrant profile 50a, 50b. Additionally, the independently-operable vertical transistors 10 of any given electronic element 100 can be all bottom-gate, all top-gate or a mix of bottom-gate and top-gate architectures as dictated by the overall function of the circuit and as such can be electrically connected to other circuit elements to form any number of functional elements previously described.

The vertical-support-element 120 as shown in FIGS. 10b and 10c is an insulating structure, and the conductive layers are conformal and formed separately from the vertical-support-element 120. The illustrated configuration includes a substrate 110 with a vertical-support-element 120 formed on the substrate 110. The vertical-support-element 120 extends away from the substrate 110 and includes a perimeter 40 having a reentrant profile 50a, 50b.

Top-gate vertical transistor 303 is formed in one portion of the reentrant profile 50a. A first conformal semiconductor layer 150 is in contact with the vertical-support-element 120 in the reentrant profile 50a. The source/drain electrodes of the top-gate vertical transistor 303 include a first electrode 180 located in contact with a first portion of the first conformal semiconductor layer 150 over the top of the vertical-support-element 120 and a second electrode 170 located in contact with a second portion of the semiconductor layer 150 over the substrate 110 and not over the vertical-support-element 120, and adjacent to the portion of the perimeter 40 of the vertical-support-element 120. Conformal dielectric layer 130 serves as the gate dielectric for the top-gate vertical transistor 303 and is on the first semiconductor layer 150 in the reentrant profile 50a. A conformal conductive top-gate 125 is over the dielectric layer 130 in the portion of reentrant profile 50a.

Bottom-gate vertical transistor 803 is formed in another portion of the reentrant profile 50b of vertical-support-element 120. Conformal conductive gate layer 825 is in the portion of the reentrant profile 50b and is in contact with the vertical-support-element 120. A second conformal dielectric layer 830 is in the corresponding reentrant profile 50b and is in contact with the gate layer 825. A second conformal semiconductor layer 850 is over the dielectric layer 830 in the second portion of the reentrant profile 50b, and is in contact with the dielectric layer 830. The source/drain electrodes of the bottom-gate vertical transistor 803 include a third electrode 875 located over the substrate 110 and not over the vertical-support-element 120, and adjacent to the portion of the perimeter 40, the third electrode 875 being in contact with the semiconductor layer 850, and a fourth electrode 885 located over the top of the vertical-support-element 120 and in contact with the semiconductor layer 850. The first electrode 180 and the second electrode 170 define a first semiconductor channel for the top-gate vertical transistor 303, and the third electrode 875 and the fourth electrode 885 define a second semiconductor channel for the bottom-gate vertical transistor 803.

As illustrated in FIGS. 10b and 10c, vertical transistors 303 and 803 are formed over a common vertical-support-element 120 and can be formed from common material layers. The elements of the vertical transistors 303 and 803 are shaded as to illustrate which elements are part of a common material layer. As shown the first conformal gate layer 125 and the source/drain electrodes of the bottom-gate vertical transistor 803 (i.e., third electrode 875 and fourth electrode 885), can be formed in a common material layer, although each is electrically distinct. Similarly, the second conformal gate layer 825 and the source/drain electrodes of the top-gate vertical transistor 303, (i.e., first electrode 180 and second electrode 170), can be formed in a common material layer. As shown the first semiconductor layer 150 is a different material layer than the second semiconductor layer 850. In some embodiments, the first semiconductor layer 150 and the second semiconductor layer 850 can be the same material. In preferred embodiments, vertical transistors 303 and 803 are n-type transistors, more preferably, n-type metal oxide thin film transistors. In preferred embodiments, both the first semiconductor layer 150 and the second semiconductor layer 850 include a ZnO-based semiconductor. As shown, the first dielectric layer 130 and the second dielectric layer 830 are two separate portions of a common dielectric layer, and as such have the same material composition and thickness. Preferably, the dielectric material is an insulating metal oxide.

Selective area deposition can be advantageously used to pattern portions of layers in devices in which a conformal gate layer of one device and the source and drain electrodes of a second device are formed over the same vertical-support-element from a common material layer. In these embodiments, the conformal conductive gate layer 825, the first electrode 180, and the second electrode 170 have the same material composition and thickness and are part of the same conductive material layer. Preferably, the conductive material composition includes a conductive metal oxide. The conductive material layer must be put down with a conformal deposition process, like ALD, in order to form the conformal gate. In order to pattern a conformal conductive material layer into separated source and drain electrodes on either side of a reentrant profile 50, a deposition inhibitor can be used to fill in the reentrant profile 50 such that the conductive material is not deposited in the reentrant profile 50. There is no easy photo-lithographic lift-off or etching process that could yield the simultaneous creation of a conformal gate and separated source/drain electrodes over the same vertical transistor structure.

Generally, the electronic elements of the present invention can be formed using any methods known in the art. In some embodiments, the source and drain electrodes of vertical transistors 10 or series-connected vertical transistor pairs 20 can be formed by a line-of-sight deposition process. Line-of-sight deposition processes include evaporation and sputtering, and most often results in an electrode that is over the top of the vertical-support-element 120 being vertically aligned, or close to vertically aligned with, the electrode at the level of the substrate 110 as the reentrant profile 50 provides a shadow structure preventing the deposition under the top of the vertical-support-element 120 in the reentrant profile 50. Alternative fabrications techniques, such as selective area deposition (SAD) can produce source and drain electrodes that are spaced further apart resulting in a longer channel length, specifically the electrode at the level of the substrate 110 will be at a greater distance from the vertical-support-element 120 than that formed by a line-of-sight deposition process. The vertical transistors 10 will have a portion of their channel that is parallel to the substrate surface in addition to the portion which is not parallel. All embodiments of vertical transistors 10 whose channel, or a portion of their channel, is within the reentrant profile 50 of a vertical-support-element 120 are within the scope of the current invention.

FIGS. 11a-11c illustrate an exemplary embodiment where a bottom-gate vertical transistor 804 and a top-gate vertical transistor 304 are formed over the same vertical-support-element 120 and are connected to provide an enhancement-depletion-mode inverter 102. FIG. 11a shows an equivalent circuit diagram for an enhancement-depletion-mode inverter, where T1 is the load transistor and T2 is the drive transistor. FIG. 11b is a plan view showing an enhancement-depletion-mode inverter 102 constructed using vertical transistors 10a and 10b. FIG. 11c is a schematic cross-sectional view of the enhancement-depletion-mode inverter 102 of FIG. 11b, taken along the line A-A'. As illustrated, bottom-gate vertical transistor 804 and top-gate vertical transistor 304 have the same elements as bottom-gate vertical transistor 803 and top-gate vertical transistor 303 discussed above with respect to FIGS. 10a-10c. In the configuration illustrated in FIGS. 11a through 11c, the top-gate vertical transistor 304 is the load transistor, T1, and the bottom-gate vertical transistor 804 is the drive transistor, T2. The top-gate vertical transistor 304 illustrated in FIGS. 11a-11c operates in a depletion-mode, while the bottom-gate vertical transistor 804 operates in an enhancement mode. The schematic illustration of FIG. 11b has elements added to indicate electrical connection to the various nodes of independently-operable vertical transistors 10a and 10b. In FIG. 11b, the circle symbol denotes electrical contact to the gate, the trapezoidal symbol denotes electrical contact to the source or drain electrode over the vertical-support-element 120, and the parallelogram symbol denotes electrical contact to the source or drain electrode at the level of the substrate 110 (not over the vertical-support-element 120).

As shown, bottom-gate vertical transistor 804 and top gate vertical transistor 304 share a common dielectric layer 130, with a portion 830 in the region of the channel of the bottom-gate vertical transistor 804. There is also a via 135 in dielectric layer 130 to allow for electrical connection between the first electrode 180 and the conformal gate layer 125, which provides a top-gate. The gate layer 125 is also extended over the top of the vertical-support-element 120 so as to connect to the fourth electrode 885. As shown in FIG. 11c, the fourth electrode 885 and the gate layer 125 are formed from a single material pattern and layer, having the same material composition and layer thickness. As shown, there is also an optional via in dielectric layer 130 to allow surface contact to the second electrode 170; the use of this and other vias will be dictated by the contact requirements of the circuitry. The remaining elements of the top-gate and bottom-gate vertical transistors 304, 804 of FIGS. 11a-11c are equivalent to those described with respect to FIGS. 10a-10c, and should be understood from the previous description. The specific layout of the enhancement-depletion-mode inverter 102 shown in FIGS. 11b and 11c is chosen for simplicity of illustration. Many designs are possible and are within the scope of the current invention as long as they meet the requirements of having a bottom-gate vertical transistor 804 and a top-gate vertical transistor 304 formed over a single vertical-support-element 120, and are properly connected as in the equivalent circuit diagram of FIG. 11a.

In some embodiments, the electronic elements of the present invention use a common shared dielectric layer (as in FIGS. 11a-11c). In some cases, the dielectric layer is a dielectric stack including a plurality of layers. The layers of the stack can each have the same pattern, as to form a thicker uniform dielectric stack or they can have different patterns in order to add additional gate dielectric to selected transistors of the electronic element. For example, a dielectric stack could be used in the structure illustrated in FIG. 11c, to add additional gate dielectric to top-gate vertical transistor 304, but not to bottom-gate vertical transistor 804 such that the dielectric layer 130 of the top-gate vertical transistor 304 is thicker than the dielectric layer 830 of the bottom-gate vertical transistor 804. The dielectric stack should be considered as a common variable thickness dielectric stack shared between the top-gate and bottom-gate vertical transistors 304, 804, with the full plurality of dielectric layers being included in the dielectric stack present at some regions of the vertical transistors, while only a portion of the plurality of layers in the dielectric stack being included in other regions of the vertical transistors. Although described in relationship to an enhancement-depletion-mode inverter arrangement, it should be understood that any arrangement of thin film transistors can include this feature.

Figure 12:
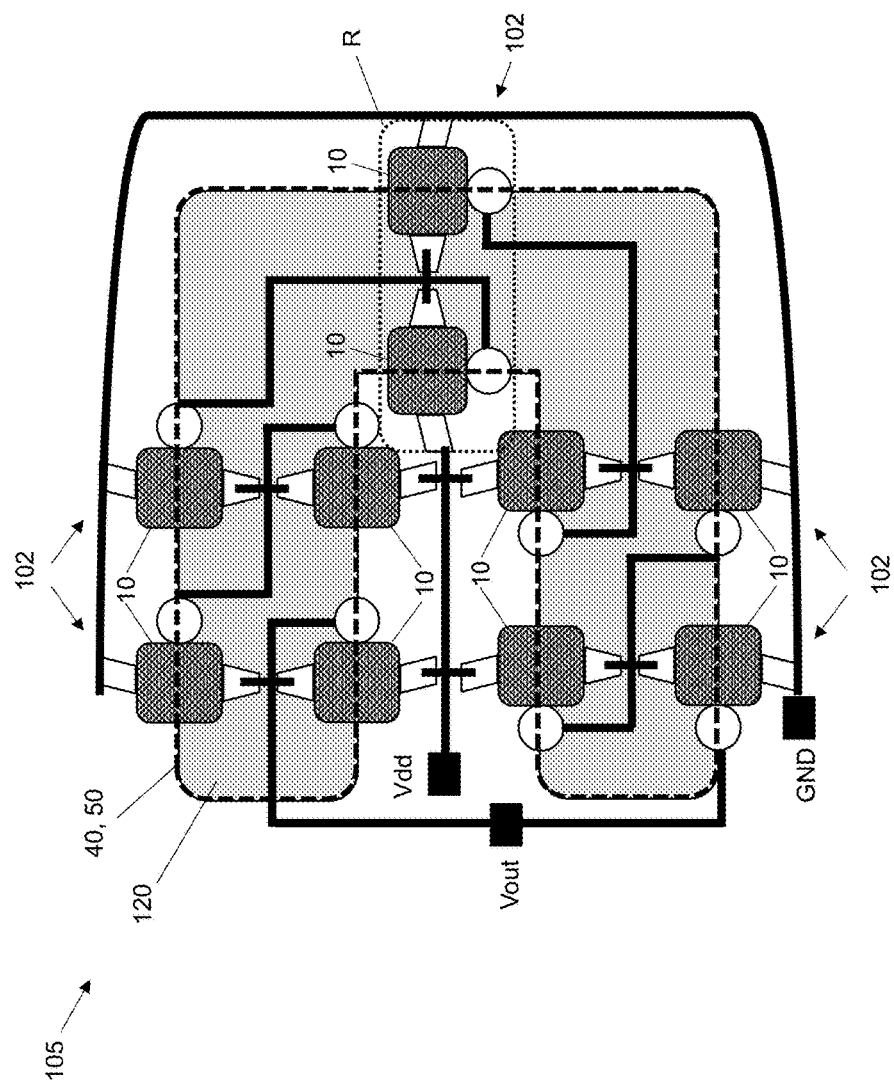
FIG. 12 is a schematic illustration of a 5-stage ring oscillator formed using five of the enhancement-depletion-mode inverters of FIG. 11b, each including two vertical transistors, where all of the vertical transistors are formed over a common vertical-support-element.

FIG. 12 illustrates the use of the enhancement-depletion-mode inverter 102 shown in FIGS. 11a-11c to provide a 5-stage ring oscillator. 105 The ring oscillator 105 includes ten independently-operable vertical transistors 10 arranged around the perimeter 40 of a common vertical-support-element 120 in the form of five enhancement-depletion-mode inverters 102. Region R indicated on FIG. 12, corresponds to region R of FIG. 11b. The bold lines of FIG. 12 are used to indicate the electrical connections between the independently-operable vertical transistors 10. The ring oscillator 105 of FIG. 12 was chosen for illustrative purposes only, and any configuration of three or more vertical transistors 10 on a common vertical support-element 120 is within the scope of the present invention.

Electronic elements constructed in accordance with the present invention can also include all-enhancement-mode inverters. An all-enhancement-mode inverter includes first and second transistors T1 and T2, where the first transistor T1 functions as a load transistor, and the second transistor T2 functions as a switching or drive transistor. Both the first transistor T1 and the second transistor T2 are operated in an enhancement mode. FIG. 13a shows a circuit diagram for an all-enhancement-mode inverter where the drive transistor T2 is a pair of series-connected transistors T2-T2' with a common gate. Embodiments where T2 is an independently-operable transistor are also included within the scope of the present invention.

As described above, an enhancement-mode device is one that is normally off, and has a threshold voltage greater than zero. In an all-enhancement-mode inverter, the source of the load transistor T1 is electrically connected to the drain of the drive transistor T2, and the drain and gate of the load transistor T1 are electrically connected. Such an all-enhancement-mode inverter 107 can be formed over a common vertical-support-element 120 as illustrated in FIGS. 13b-13d in accordance with the present invention. The specific layout will be chosen which best suits the application and overall circuit element layout. Many designs are possible and are within the scope of the current invention as long as they meet the requirements of having three of more vertical transistors formed over a single vertical-support-element, and are properly connected.

While the present invention is directed at multiple vertical transistors 10, 21, 22 formed over a single vertical support element 120, these vertical transistors 10, 21, 22 can be combined in circuits with planar thin film transistors (top-gate or bottom-gate) in order to meet the circuit performance needs of a given application. Similarly, planar dual-gate thin film transistors can be used when advantageous to the circuit performance. Exemplary combinations of vertical transistors and planar thin film transistors have been described in the aforementioned U.S. Pat. No. 9,117,914.

All of the thin-film transistors described thus far are preferably composed of thin-film inorganic material layers. Each transistor architecture can be fabricated using the combination of SALD and selective area deposition (SAD). Using selective area deposition in combination with ALD to pattern thin-film inorganic layers has the benefit of being an additive patterning technology, where there is no need to be concerned with the relative etch rates of the different materials. Preferably each of the layers of the transistors illustrated are formed from metal oxides, as described earlier.

When using an additive patterning technique, like SALD in combination with SAD, multiple types of architectures can easily be fabricated on the same substrate. Transistors of different architectures can be chosen for their individual performance attributes, for example as discussed in commonly-assigned U.S. Pat. No. 9,368,490, which is incorporated herein by reference, planar top-gate and bottom-gate transistors can be integrated to form enhancement-depletion-mode circuitry. As illustrated in FIGS. 10a-10c, a top-gate vertical transistor 303 and a bottom-gate vertical transistor 803 can be built over a single vertical-support-element 120 and can share common patterned material layers. In circuit design, it is usually necessary to vary the width (W) and length (L) of the semiconductor channel of different elements in the circuitry on a single substrate. Vertical transistors typically have short channel lengths, which are advantaged for high current needs. Planar transistors typically have longer channels than vertical transistors, when high-end photolithography is not employed in processing. In some applications, the use of long channel vertical transistors is useful to adjust W and L to achieve the desired relative TFT performance. The ability to mix and match vertical and planar transistors, with both top-gate and bottom-gate architectures, is useful for the ease of sizing transistor components in complex circuitry. Both long channel vertical transistors and planar transistors have channel lengths that are primarily (or fully in the case of a planar TFT) defined by the length of the channel that is parallel to the substrate. Electronic components with mixed devices have a first transistor where at least a portion of the first semiconductor channel extends a direction parallel to the substrate, a vertical-support-element, and a second transistor with a channel having at least a portion extending in a direction orthogonal to the substrate.

Table 1 illustrates different transistor architectures formed from common material layers over a single substrate. In Table 1, staggered contacts are abbreviated as "stag," coplanar contacts are abbreviated as "cp," bottom-gate is abbreviated "BG," top-gate is abbreviated "TG," and vertical-support-element is abbreviated as "V-S-E."

TABLE 1

| ID | Layer | BG-VTFT | BG-VTFT | TG-VTFT | TG-VTFT | DUAL-VTFT | BG-planar | BG-planar | TG-planar | TG-planar |
|---|---|---|---|---|---|---|---|---|---|---|
| | Contact geometry: | stag | cp | stag | cp | stag | stag | cp | stag | cp |
| A | Thick Insulator | V-S-E | V-S-E | V-S-E | V-S-E | V-S-E | — | — | — | — |
| B | Conductive Layer | Gate | Gate | S/D | — | Gate | Gate | Gate | S/D | — |
| C | Semiconductor Layer | — | — | Semi | Semi | — | — | — | Semi | Semi |
| D | Dielectric Layer | Diel | Diel | Diel | — | Diel | Diel | Diel | Diel | — |
| E | Semiconductor Layer | Semi | — | — | — | Semi | Semi | — | — | — |
| F | Conductive Layer | S/D | S/D | Gate | S/D | S/D | S/D | S/D | Gate | S/D |
| G | Dielectric Layer | — | — | — | Diel | Diel | — | — | — | Diel |
| H | Conductive Layer | — | — | — | Gate | TG | — | — | — | Gate |
| I | Semiconductor Layer | — | Semi | — | — | — | — | Semi | — | — |

Table 1 illustrates 9 different transistor architectures that are possible to make on the same substrate from the combination of 9 different layers. With the exception of layer A (the thick insulator used to form the vertical-structureelement), the all remaining layers (B-I) are preferably conformal thin-film inorganic layers that are deposited and patterned using the combination of SALD and SAD. Although denoted in Table 1 as layers, each layer in Table 1 could be a single layer or a multilayer stack of the same or different materials as long as the final stack has the properties associated with the layer in Table 1. Table 1 is not limiting in the number of common or shared layers possible in constructing transistors of various architectures on a single substrate. That is, additional layers can be added prior to layer A, after layer I, or in between any of the layers listed in Table 1. For example, it may be desirable to have a patterned conductive layer on the substrate prior to forming layer A to act as the primary power lines for a given circuit. In some circumstances, it is desirable to form a passivation layer after forming the last semiconductor layer I. Furthermore, it is not required that all of the layers A through I are present on the substrate, only that there is a sufficient number of layers to form the desired elements. In one embodiment, there is a bottom-gate VTFT and a bottom-gate planar TFT formed on the same substrate, both having a staggered arrangement for the source/drain electrode. In this embodiment, only five common layers A, B, D, E and F are required to form the elements of the two transistor architectures.

FIGS. 13a-13d are illustrative of an embodiment of the present invention where two bottom-gate vertical transistors 425, 435 (i.e., series-connected vertical transistor pair 20 including vertical transistors 21, 22) and a planar bottom-gate thin film transistor 80 are configured to operate as an all-enhancement-mode inverter 107 having the equivalent circuit diagram of FIG. 13a. As illustrated, bottom-gate vertical transistor 425 is formed over the same vertical-support-element 120, and in series with, bottom-gate vertical transistor 435. This arrangement of using two bottom-gate vertical transistors 425, 435 in a series-connected vertical transistor pair 20 provides an equivalent drive transistor for an all-enhancement-mode inverter as shown in the equivalent circuit of FIG. 13a. Using a series-connected vertical transistor pair 20 over a single vertical-support-element 120 as an equivalent drive transistor is useful in any logic gate or circuit where the drive TFT is a vertical transistor (a short channel device) and the load TFT is a planar device, since this arrangement puts the necessary external electrical connections at the level of the substrate. The bottom-gate vertical transistors 425 and 435 are equivalent to previously discussed bottom-gate vertical transistors (such as those shown in FIGS. 6b-6d), and should be understood. Similarly, the bottom-gate planar thin film transistor 415 is a typical bottom-gate planar transistor and is well known in the art. The three transistors on the common substrate 110 of FIG. 13b-d are formed from five layers, each with elements in four common layers (layers B, D, E and F from Table 1). As shown in FIGS. 13c and 13d, source 18 of the bottom-gate planar thin film transistor 80 is electrically and physically connected to the second electrode 870 of the second bottom-gate vertical transistor 425. The drain 19 of the planar thin film transistor 80 is connected to its own gate 12, through a via in the common dielectric layer 830, as shown by an "X" in FIG. 13c.

Figure 14:
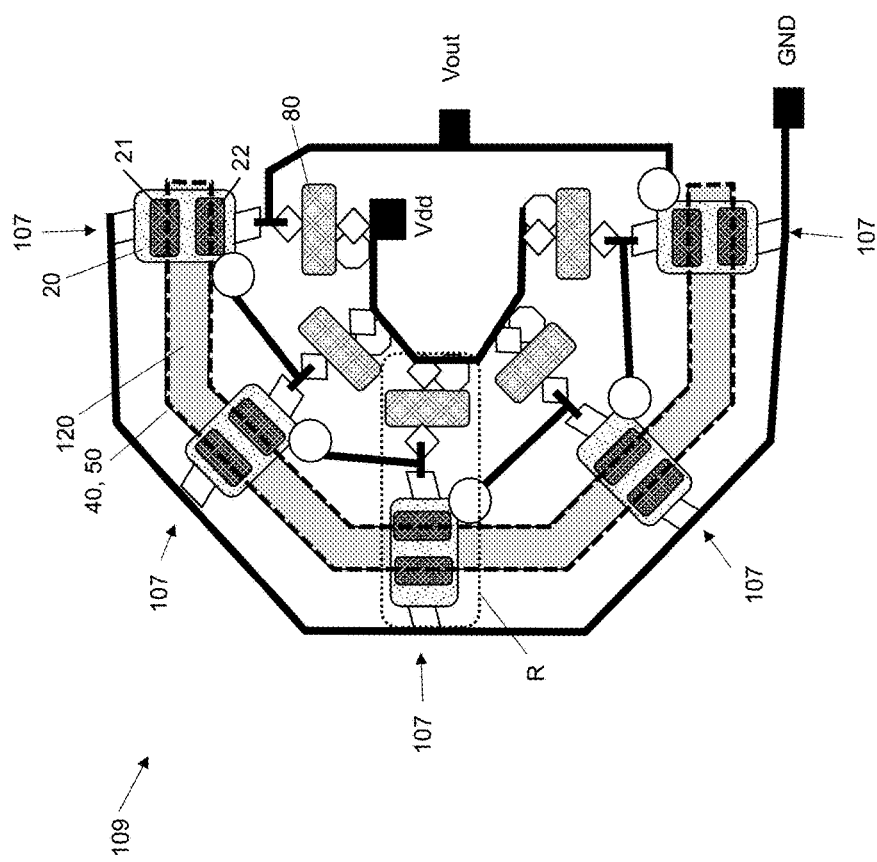
FIG. 14 is a schematic illustration of a 5-stage ring oscillator using five of the all-enhancement-mode inverters of FIG. 13b, each including a pair of series-connected vertical transistors and a planar transistor, where all of the vertical transistors are formed over a common vertical-support-element.

FIG. 14 illustrates the use of the all-enhancement-mode inverter 107 shown in FIGS. 13a-13d in a 5-stage ring oscillator 107. There are five series-connected vertical transistor pairs 20 each with a common gate, arranged around the perimeter 40 of a common vertical-support-element 120. A planar thin film transistor 80 is electrically connected to the each of the series-connected vertical transistor pairs 20 as illustrated in FIGS. 13a-13d to form a set of five all-enhancement-mode inverters 107. Region R of FIG. 14 corresponds to Region R of FIG. 13c. The ring oscillator 109 of FIG. 14 was chosen for illustrative purposes only to demonstrate that configurations of three or more vertical transistors 21, 22 on a common vertical support-element 120 can be combined with planar thin film transistors 80 to provide a single circuit element and are within the scope of the present invention. As with FIG. 12, the bold lines of FIG. 13 are used to indicate the electrical connections between the individual components of the circuit.

The invention has been described in detail with particular reference to certain preferred embodiments thereof, but it will be understood that variations and modifications can be effected within the spirit and scope of the invention.

PARTS LIST 10 vertical transistor
12 gate
18 source
20 series-connected vertical transistor pair
20a, 20b, 20c series-connected vertical transistor pair
21 vertical transistor
21a, 21b, 21c vertical transistor
22 vertical transistor
22a, 22b, 22c vertical transistor
40 perimeter
40a outer perimeter
40b inner perimeter
50, 50a, 50b reentrant profile
80 planar thin film transistor
100 electronic element
102 enhancement-depletion-mode inverter
105 ring oscillator
107 all-enhancement-mode inverter
109 ring oscillator
110 substrate
120 vertical-support-element
125 gate layer
130 dielectric layer
135 via
140 post
145 cap
150 semiconductor layer
170 second electrode
175 third electrode
180 first electrode
303 top-gate vertical transistor
304 top-gate vertical transistor
425 bottom-gate vertical transistor
435 bottom-gate vertical transistor
500 width
505 minimum width
510 first side edge
520 second side edge
530 height dimension
535 top
801 bottom-gate vertical transistor
802 bottom-gate vertical transistor
803 bottom-gate vertical transistor
804 bottom-gate vertical transistor
811 top-gate vertical transistor
812 top-gate vertical transistor
825 gate layer
830 dielectric layer
850 semiconductor layer
870 second electrode 875 third electrode
880 first electrode
885 fourth electrode
P-P' cross-section line
A-A' cross-section line
R region

The invention claimed is:

1. An electronic element comprising: a substrate;
a vertical-support-element boated on the substrate, the vertical-support-element extending away from the substrate and having a perimeter over the substrate, wherein the vertical-support-element has a reentrant profile around at least a portion of the perimeter; and
three or more vertical transistors positioned at distinct non-overlapping positions around the perimeter of the vertical-support-element, each of the vertical transistors having a semiconductor channel being located in a corresponding region of the reentrant profile.

2. The electronic element of claim 1, wherein the three or more vertical transistors include at least one vertical transistor that is independently operable.

3. The electronic element of claim 1, wherein the three or more vertical transistors include at least one pair of series-connected vertical transistors, each pair of series-connected vertical transistors including a first vertical transistor having a first semiconductor channel and a second vertical transistor having a second semiconductor channel, wherein the first vertical transistor and the second vertical transistor have an electrically common gate electrode.

4. The electronic element of claim 3, wherein the first vertical transistor and the second vertical transistor in a particular pair of series-connected vertical transistors are positioned on opposite sides of the vertical support structure.

5. The electronic element of claim 3, wherein the first vertical transistor and the second vertical transistor in a particular pair of series-connected vertical transistors are positioned on adjacent sides of the vertical-support-structure.

6. The electronic element of claim 3, wherein the first vertical transistor and the second vertical transistor in a particular pair of series-connected vertical transistors are positioned on the same side of the vertical-support-structure in adjacent regions of the reentrant profile.

7. The electronic element of claim 1, wherein the three or more vertical transistors include:
an independently operable vertical transistor; and
a pair of series-connected vertical transistors including a first vertical transistor having a first semiconductor channel and a second vertical transistor having a second semiconductor channel, wherein the first vertical transistor and the second vertical transistor have an electrically common gate electrode.

8. The electronic element, of claim 1, wherein the vertical-support-element has a substantially rectangular perimeter having four edges, and wherein each of the vertical transistors is formed on one of the edges.

9. The electronic element of claim 1, wherein each vertical transistor includes:
a conformal semiconductor layer including a first portion over the top of the vertical-support-element, a second portion over the substrate and not over the vertical-support-element, and a third portion located in the corresponding region of the reentrant profile;
a first electrode located in contact with the first portion of the conformal semiconductor layer;
a second electrode located in contact with the second portion of the conformal semiconductor layer;
a conformal conductive gate layer including a portion located in the corresponding region of the reentrant profile; and
a conformal dielectric layer including a portion located in the corresponding region of the reentrant profile between the conformal semiconductor layer and the conformal conductive gate layer;
wherein the semiconductor channel corresponds to a portion of the conformal semiconductor layer between the first electrode and the second electrode.

10. The electronic', element of claim 9, wherein at least one of the vertical transistors is a top-gate transistor wherein the conformal semiconductor layer is located over the vertical support element, the conformal dielectric layer is located over the conformal semiconductor layer, and the conformal conductive gate layer is located over the conformal dielectric layer.

11. The electronic element of claim 9, wherein at least one of the vertical transistors is a bottom-gate transistor wherein the conformal conductive gate layer is located over the vertical support element, the conformal dielectric layer is located over the conformal conductive gate layer, and the conformal semiconductor layer located over the conformal dielectric layer.

12. The electronic element of claim 1, wherein the vertical-support-element includes a polymer post and an inorganic material cap on top of the polymer post.

13. The electronic element of claim 1, wherein at least one of the vertical transistors is an enhancement-mode transistor.

14. The electronic element of claim 1, wherein at least one of the vertical transistors is a depletion-mode transistor.

15. The electronic element of claim 1, wherein at least one of the vertical transistors is an n-type transistor.

16. The electronic element of claim 15, wherein the n-type transistor is a metal oxide thin film transistor.

17. The electronic element of claim 1, wherein two or more of the vertical transistors positioned around the perimeter of the vertical-support-element are electrically connected to form a multi-transistor electronic component.

18. The electronic element of claim 17, wherein the multi-transistor electronic component further includes a planar thin film transistor.

19. The electronic element of claim 17, wherein the multi-transistor electronic component includes an inverter.

20. The electronic element of claim 19, wherein the inverter is an enhancement-depletion-mode inverter in which the first electrode of a first vertical transistor is electrically connected to the first electrode of a second vertical transistor and the conformal conductive gate layer of the first vertical transistor, wherein the first vertical transistor is a top-gate transistor and the second vertical transistor is a bottom-gate transistor.

21. The electronic element of claim 19, wherein the inverter is an all-enhancement-mode inverter in which a pair of series connected vertical transistors positioned around the perimeter of the vertical-support-element electrically connected to a planar thin film transistor.

22. The electronic element of claim 17, wherein the multi-transistor electronic component is a logic gate.

* * * * *